US012588554B2

(12) United States Patent
Chen et al.

(10) Patent No.: US 12,588,554 B2
(45) Date of Patent: Mar. 24, 2026

(54) SEMICONDUCTOR DEVICE AND METHOD FORMING SAME

(71) Applicant: Taiwan Semiconductor Manufacturing Co., Ltd., Hsinchu (TW)

(72) Inventors: Yi-Jung Chen, Yilan City (TW); Tsung-Fu Tsai, Changhua City (TW); Szu-Wei Lu, Hsinchu (TW); Chung-Shi Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 722 days.

(21) Appl. No.: 17/892,821

(22) Filed: Aug. 22, 2022

(65) Prior Publication Data

US 2024/0063204 A1    Feb. 22, 2024

(51) Int. Cl.
| | |
|---|---|
| *H01L 25/18* | (2023.01) |
| *H01L 21/48* | (2006.01) |
| *H01L 21/56* | (2006.01) |
| *H01L 23/00* | (2006.01) |
| *H01L 23/31* | (2006.01) |
| *H01L 23/498* | (2006.01) |

(52) U.S. Cl.
CPC .......... *H01L 25/18* (2013.01); *H01L 21/4853* (2013.01); *H01L 21/563* (2013.01); *H01L 23/3135* (2013.01); *H01L 23/49811* (2013.01); *H01L 24/08* (2013.01); *H01L 24/16* (2013.01); *H01L 24/32* (2013.01); *H01L 24/73* (2013.01); *H01L 24/80* (2013.01); *H01L 24/13* (2013.01);

*H01L 2224/08225* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16238* (2013.01); *H01L 2224/32225* (2013.01); *H01L 2224/73204* (2013.01); *H01L 2224/80895* (2013.01); *H01L 2224/80896* (2013.01)

(58) Field of Classification Search
CPC .... H01L 25/18; H01L 21/4853; H01L 21/563
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| | (Continued) | | |

FOREIGN PATENT DOCUMENTS

| | | |
|---|---|---|
| CN | 114050131 A | 2/2022 |
| TW | 201025554 A | 7/2010 |
| | (Continued) | |

*Primary Examiner* — Errol V Fernandes
(74) *Attorney, Agent, or Firm* — Slater Matsil, LLP

(57) ABSTRACT

Integrated circuit package structures and methods of forming integrated circuit package structures are discussed. An integrated circuit package structure, in accordance with some embodiments, includes an integrated circuit package substrate with a heterogeneous bonding scheme that includes conductive pillars for bonding semiconductor devices to as well as a region including conductive connectors embedded in a dielectric for bonding additional semiconductor devices.

20 Claims, 18 Drawing Sheets

(56)         References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,922,845 B1 | 3/2018 | Shih | |
| 11,756,928 B2 | 9/2023 | Chen et al. | |
| 2015/0102482 A1 | 4/2015 | Liu et al. | |
| 2020/0006309 A1* | 1/2020 | Chen ...................... | H01L 24/73 |
| 2020/0350218 A1 | 11/2020 | Kuo et al. | |
| 2021/0050295 A1* | 2/2021 | Tsai ................... | H01L 21/6835 |
| 2022/0384374 A1 | 12/2022 | Yu et al. | |

FOREIGN PATENT DOCUMENTS

| | | | |
|---|---|---|---|
| TW | 201515172 A | 4/2015 | |
| TW | 201818520 A | 5/2018 | |
| TW | 201917847 A | 5/2019 | |
| TW | 202042283 A | 11/2020 | |
| TW | 202209517 A | 3/2022 | |

* cited by examiner

SEMICONDUCTOR DEVICE AND METHOD FORMING SAME

BACKGROUND

Integrated circuit packages may have a plurality of package components such as device dies and package substrates bonded together to increase the functionality and integration level. Due to the differences between different materials and dimensions of the plurality of package components, integration issues may occur. With the increase in the size of the packages, package component integration becomes more complex. Further, as integrated circuit packages develop, the package component density requirements of these integrated circuit packages increases which means greater need for creative package component integration to address new problems associated with the increased complexity in these integrated circuit packages. These new problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2:
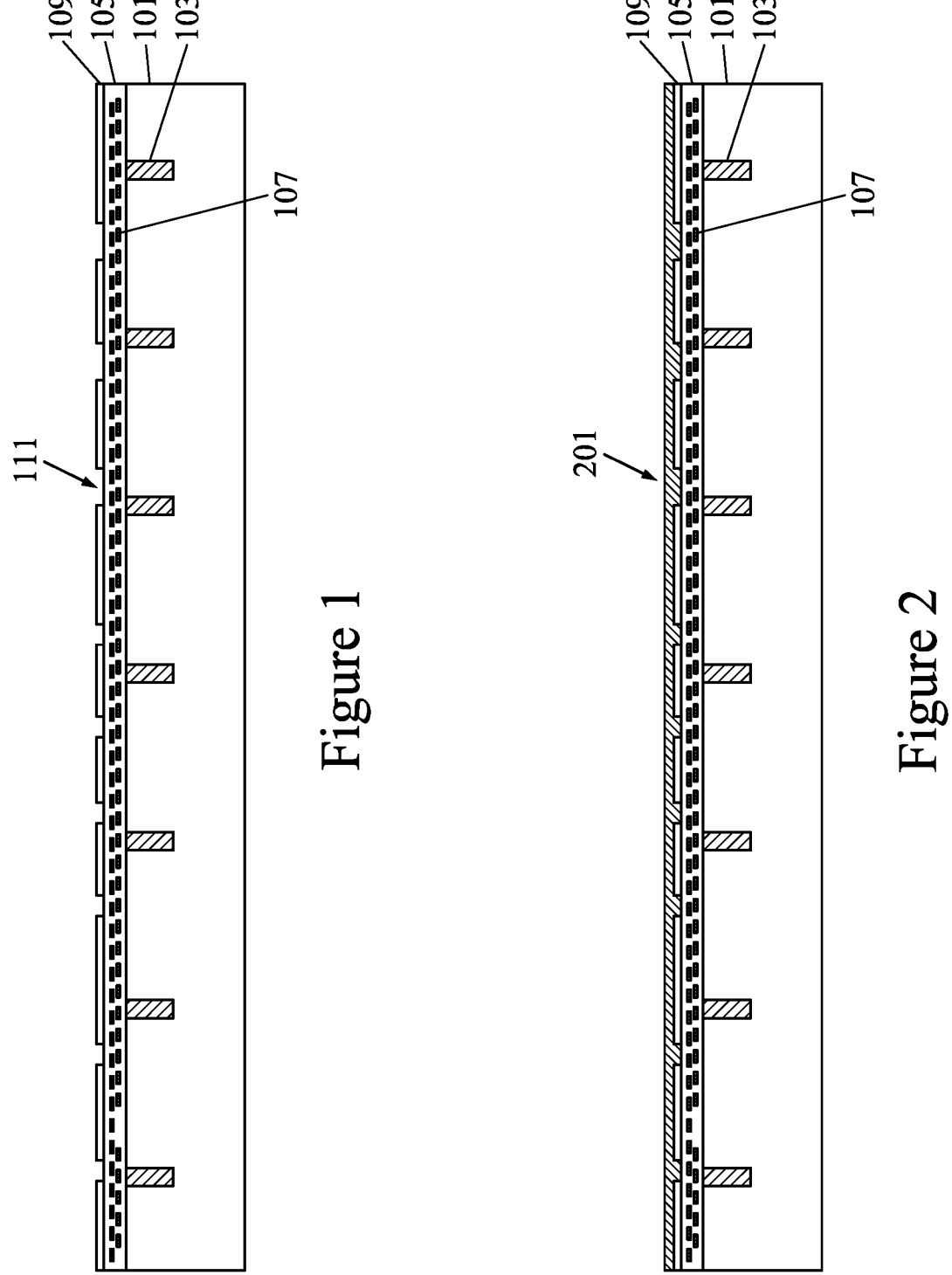
FIG. 1 illustrates the cross-sectional view of a substrate with a patterned dielectric layer, in accordance with some embodiments.
FIG. 2 illustrates the cross-sectional view of a conductive material over the patterned dielectric layer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit package such as a Chip on Wafer on Substrate (CoWoS) and the method of forming the same are provided as embodiments of the ideas presented herein. In accordance with some embodiments of the present disclosure, a heterogeneous integration scheme comprising attaching various semiconductor package components to an interposer via an underbump metallization joint and attaching other semiconductor package components to the interposer via a direct bonding method. The using of a heterogeneous integration scheme enables the attachment of various semiconductor package components to a semiconductor substrate by more than one method, where one method may be more suited to one semiconductor package component and another method may be more suited to another semiconductor package component. Embodiments discussed herein are to provide examples to enable making or using the subject matter of this disclosure. Although method embodiments may be discussed as being performed in a particular order, other method embodiments may be performed in any order.

In FIG. 1, a substrate 101 is formed or obtained. The substrate 101 may be an interposer substrate, which may be a semiconductor substrate such as a silicon substrate. The substrate 101 may also be formed of another semiconductor material such as silicon germanium, silicon carbon, or the like. However, any suitable materials may be utilized.

Optionally, active devices such as transistors (not separately illustrated) are formed at a surface of the substrate 101. Passive devices (not separately illustrated) such as resistors and/or capacitors may also be formed in the substrate 101. In accordance with some embodiments of the present disclosure, the substrate 101 may be a semiconductor substrate or a dielectric substrate, and the substrate 101 may not include active devices therein. In accordance with these embodiments, the substrate 101 may, or may not, include passive devices formed therein. In some embodiments, the substrate 101 is an active semiconductor die.

Additionally, the substrate 101 may comprise through vias 103 which may be formed to extend from the top surface of the substrate 101 into the substrate 101. In embodiments in which the substrate 101 is a silicon interposer or an organic interposer, the through vias 103 may be referred to as through-substrate vias or through-silicon vias. As an example to form the through vias 103, recesses can be formed in the substrate 101 by etching, milling, laser techniques, a combination thereof, and/or the like. A thin dielectric material (not separately illustrated) may be formed in the recesses, such as by using an oxidation technique. A thin barrier layer (not separately illustrated) may be conformally deposited in the recesses, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the recesses. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and the barrier layer are removed from a topmost surface of the substrate 101 by, for example, a chemical-mechanical polish (CMP). Remaining portions of the barrier layer and conductive material form the through vias 103.

Further, an interconnect structure 105 may be formed over the substrate 101. The interconnect structure 105 may be referred to as a back end of line (BEOL) interconnect. The interconnect structure 105 may include a plurality of dielectric layers (not separately illustrated), metal lines 107 formed in the dielectric layers, and vias (not separately illustrated) formed between, and interconnecting, the overlying and underlying metal lines 107. The interconnect structure 105 providing for electrical coupling of subsequently attached devices (e.g. a first semiconductor device 1150, see FIG. 11) to other subsequently attached devices (e.g. a second semiconductor device 1250, see FIG. 12, or a third semiconductor device 1350, see FIG. 13) as well as to external devices (see FIG. 17). In some embodiments, the metal lines 107 and the vias may be formed of copper, aluminum, nickel, tungsten, or alloys thereof and the dielectric layers may be formed of silicon oxide, silicon nitride, silicon carbide, silicon oxynitride, combinations thereof, and/or multi-layers thereof.

In FIG. 1, a first dielectric layer 109 is formed over the interconnect structure 105. Acceptable dielectric materials for the first dielectric layer 109 include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobutene (BCB) based polymer, or the like. The first dielectric layer 109 may be formed by spin coating, lamination, chemical vapor deposition (CVD), or the like. The first dielectric layer 109 then is patterned using, e.g., a photolithographic masking and etching process, although any suitable patterning process may be utilized. The patterning forms openings 111 exposing conductive portions of the interconnect structure 105.

In FIG. 2, a conductive material 201 is formed in the openings 111 and over the first dielectric layer 109. As an example to form the conductive material 201, a seed layer (not separately illustrated) may be formed over the first dielectric layer 109 and in the openings 111 extending through the first dielectric layer 109. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. The conductive material 201 is then formed on the seed layer. The conductive material 201 may be formed by plating, such as electroplating or electroless plating, or the like. The conductive material 201 may comprise a metal, like copper, titanium, tungsten, aluminum, or the like.

Figure 3:
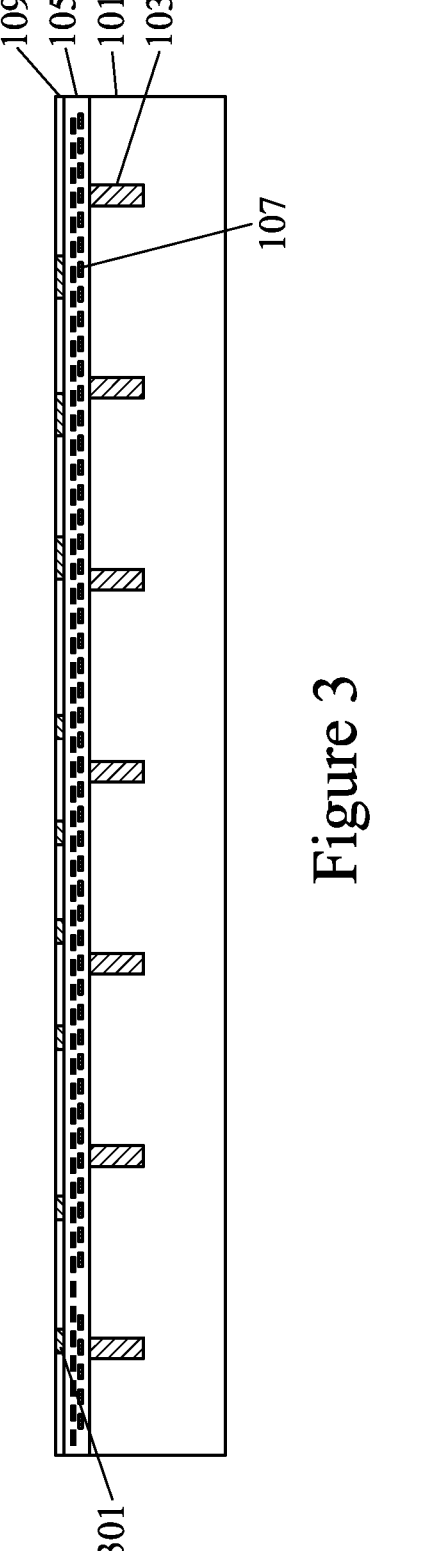
FIG. 3 illustrates the cross-sectional view of the conductive material planarized with the patterned dielectric layer, in accordance with some embodiments.

In FIG. 3, first conductive connectors 301 are formed from the conductive material 201 in the openings 111. In an embodiment, the first conductive connectors 301 are formed by removing excess material of the conductive material 201 from a surface of the first dielectric layer 109 by, for example, a planarization process such as a chemical-mechanical polish (CMP), wherein the remaining conductive material 201 in the openings 111 of the first dielectric layer 109 forms the first conductive connectors 301. The first conductive connectors 301 provide an electrical contact point for external connection to the interconnect structure 105 for the integrated circuit devices to electrically couple to.

Figure 4:
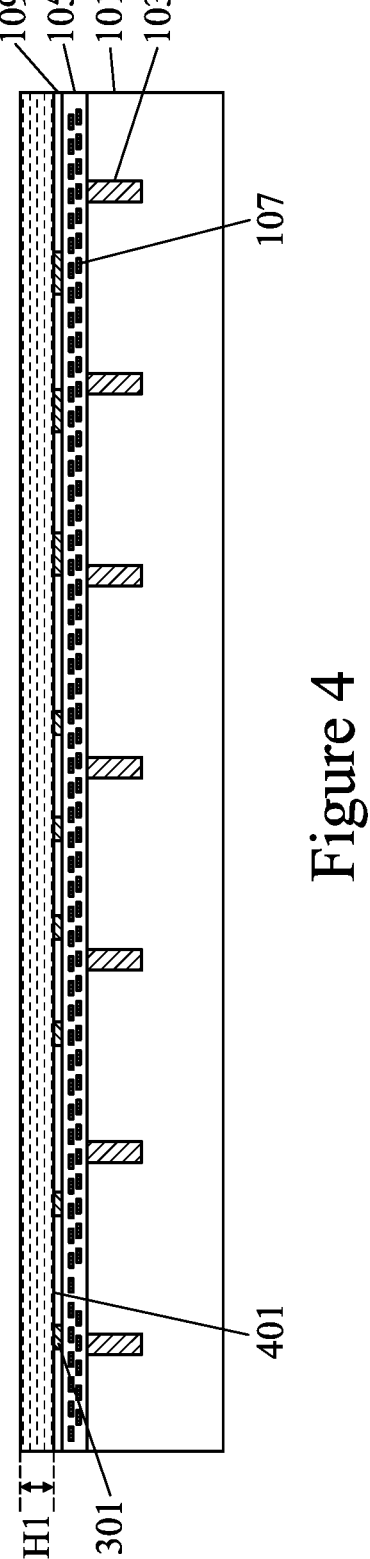
FIG. 4 illustrates the cross-sectional view of a passivation layer over the patterned dielectric layer, in accordance with some embodiments.

In FIG. 4, a passivation layer 401 is formed over the first dielectric layer 109 and the first conductive connectors 301. In an embodiment the passivation layer 401 may be a dielectric material such as silicon nitride, silicon oxide, silicon oxynitride, silicon carbide, silicon oxycarbide, polybenzoxazole (PBO), polyimide, benzocyclobutene (BCB), combinations of different layers of these, or the like. The passivation layer 401 may be formed using a deposition process such as chemical vapor deposition, physical vapor deposition, atomic layer deposition, combinations of these, or the like. However, any suitable materials and methods of deposition may be utilized. In an embodiment, the passivation layer 401 may be formed to a first height H1, such as in the range from 20 nm to 500 nm (e.g. 40 nm). However, any suitable height may be utilized.

Figure 5:
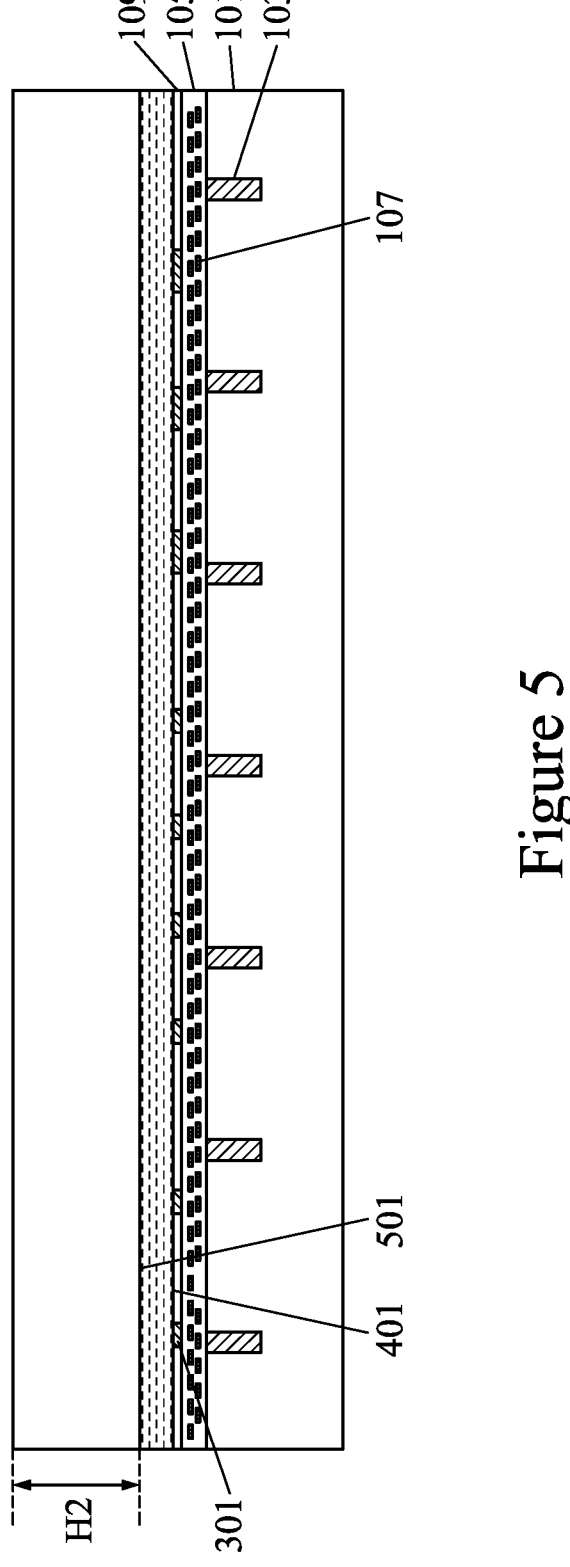
FIG. 5 illustrates the cross-sectional view of a photoresist layer over the passivation layer, in accordance with some embodiments.

In FIG. 5, a photoresist layer 501 is formed over the passivation layer 401. In an embodiment the photoresist layer 501 may be a single layer of photosensitive material or else may be multiple layers of materials, such as by being a tri-layer photoresist with a bottom anti-reflective coating (BARC) layer (not separately illustrated), a first intermediate mask layer (not separately illustrated), and a top photosensitive layer (not separately illustrated).

In an embodiment in which the photoresist layer 501 is a single layer of photosensitive material, the photoresist layer 501 is applied using, e.g., a spin-on process, and includes a photoresist polymer resin along with one or more photoactive compounds (PACs) in a photoresist solvent. The PACs will adsorb a patterned light source (discussed further below with respect to FIG. 6) and generate a reactant in those portions of the photosensitive layer that are exposed, thereby causing a subsequent reaction with the photoresist polymer resin that can be developed in order to replicate the patterned energy source within the photosensitive layer.

In an embodiment in which the photoresist layer 501 is the tri-layer photoresist, the BARC layer is applied in preparation for an application of the top photosensitive layer. The BARC layer works to prevent the uncontrolled and unde-sired reflection of energy (e.g., light) back into the overlying top photosensitive layer during an exposure of the top photosensitive layer, thereby preventing the reflecting light from causing reactions in an undesired region of the top photosensitive layer. Additionally, the BARC layer may be used to provide a planar surface, helping to reduce the negative effects of the energy impinging at an angle.

The first intermediate mask layer may be placed over the BARC layer. In an embodiment the first intermediate mask layer is a hard mask material such as silicon nitride, oxides, oxynitride, silicon carbide, amorphous silicon, combinations of these, or the like. The hard mask material for the first intermediate mask layer may be formed through a process such as chemical vapor deposition (CVD), although other processes, such as plasma enhanced chemical vapor depo-sition (PECVD), low pressure chemical vapor deposition (LPCVD), spin-on coating, or even silicon oxide formation followed by nitridation, may be utilized. Any suitable method or combination of methods to form or otherwise place the hardmask material may be utilized, and all such methods or combinations are fully intended to be included within the scope of the embodiments.

In an embodiment the top photosensitive layer is applied over the first intermediate mask layer using, e.g., a spin-on process, and includes a photoresist polymer resin along with one or more photoactive compounds (PACs) in a photoresist solvent. The PACs will adsorb the patterned light source and generate a reactant in those portions of the top photosensi-tive layer that are exposed, thereby causing a subsequent reaction with the photoresist polymer resin that can be developed in order to replicate the patterned energy source within the top photosensitive layer.

In some embodiments, the photoresist layer 501 is formed to a second height H2. The second height H2 of the photoresist layer 501 may be selected in order to tune the height of subsequently formed structures (e.g. conductive pillars 903, see FIG. 9). The second height H2, such as in the range of 6 μm to 16 μm (e.g. 8 μm). However, the photoresist layer 501 may be formed to any suitable height.

Figure 6:
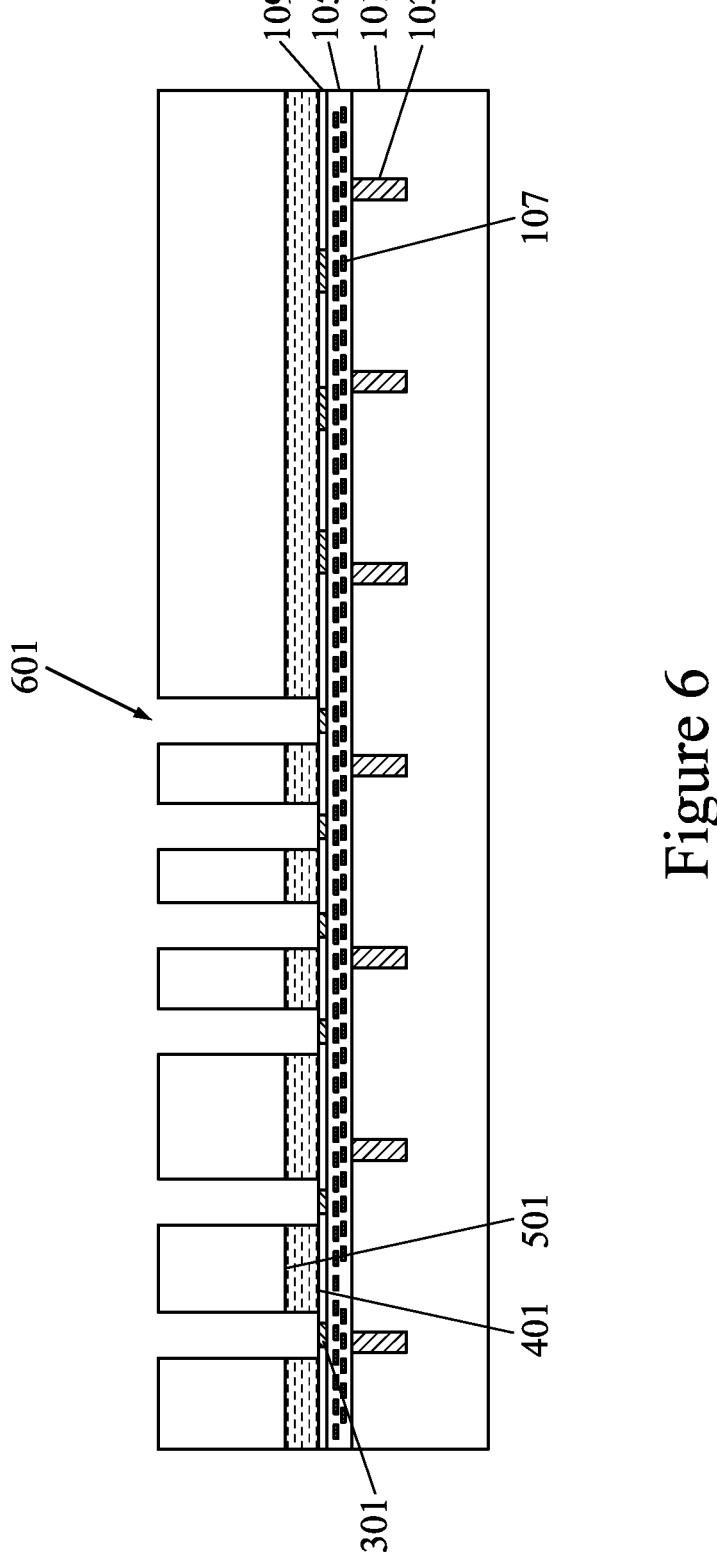
FIG. 6 illustrates the cross-sectional view of openings in the passivation layer and photoresist, in accordance with some embodiments.

In FIG. 6, openings 601 are formed extending through the photoresist layer 501 and the passivation layer 401 to expose a first subset of the first conductive connectors 301 and portions of a topmost surface of the first dielectric layer 109. In some embodiments, forming the openings 601 comprises forming a first opening (not separately illustrated) through the photoresist layer 501 and forming a second opening (not separately illustrated) through the passivation layer 401. In some embodiments the forming the first opening may be performed by exposing the photosensitive layer to a pat-terned energy source (e.g., light), the patterned energy source corresponding to the subsequently formed openings 601 and developing the photosensitive layer in order to form a first mask in the photosensitive layer. Once the photosen-sitive layer has been patterned, and in embodiments in which the photoresist layer 501 is a tri-layer photoresist, the top photosensitive layer may be used as a mask along with one or more etch processes in order to pattern the underlying BARC layer and the first intermediate mask layer forming the first opening and exposing a topmost surface of the passivation layer 401. Following the formation of the first opening the second opening may be formed in the passiva-tion layer 401. In some embodiments, the forming the second opening may be performed utilizing any suitable etchants and etching processes.

Figure 7:
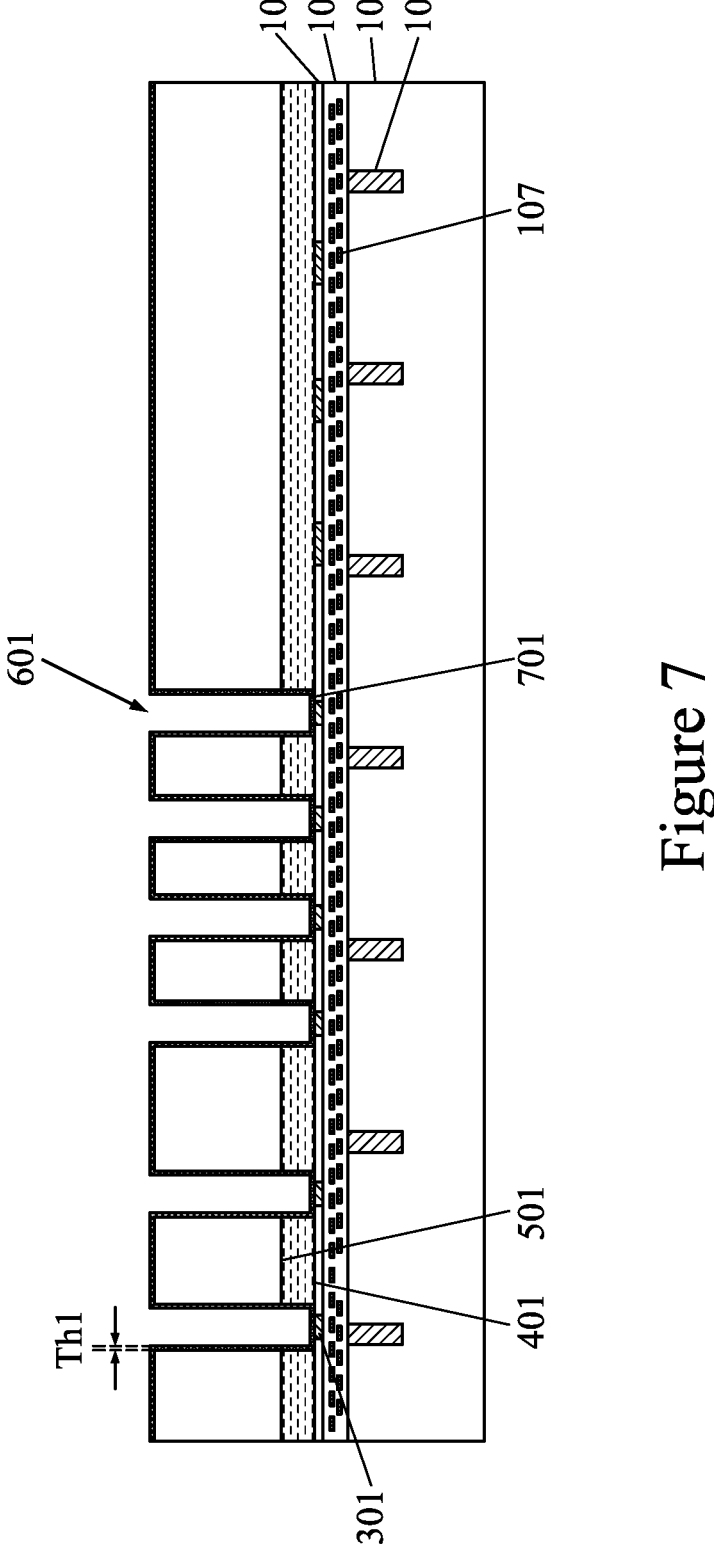
FIG. 7 illustrates the cross-sectional view of a seed layer over the passivation layer and photoresist, in accordance with some embodiments.

In FIG. 7, a seed layer 701 is formed over a topmost surface of the photoresist layer 501 and on exposed surfaces in the openings 601. In some embodiments the seed layer 701 is a thin layer of a conductive material that aids in the formation of a thicker layer during subsequent processing steps. In some embodiments, the seed layer 701 is formed to a first thickness Th1, the first thickness Th1 having the range of 0.5 kA to 3 kA. In accordance with some embodiments, the seed layer 701 may comprise a layer of titanium (not separately illustrated) followed by a layer of copper (not separately illustrated), however, any suitable number of layers or materials may be utilized. The seed layer 701 may be created using processes such as sputtering, evaporation, or PECVD processes, depending upon the desired materials.

Figure 8:
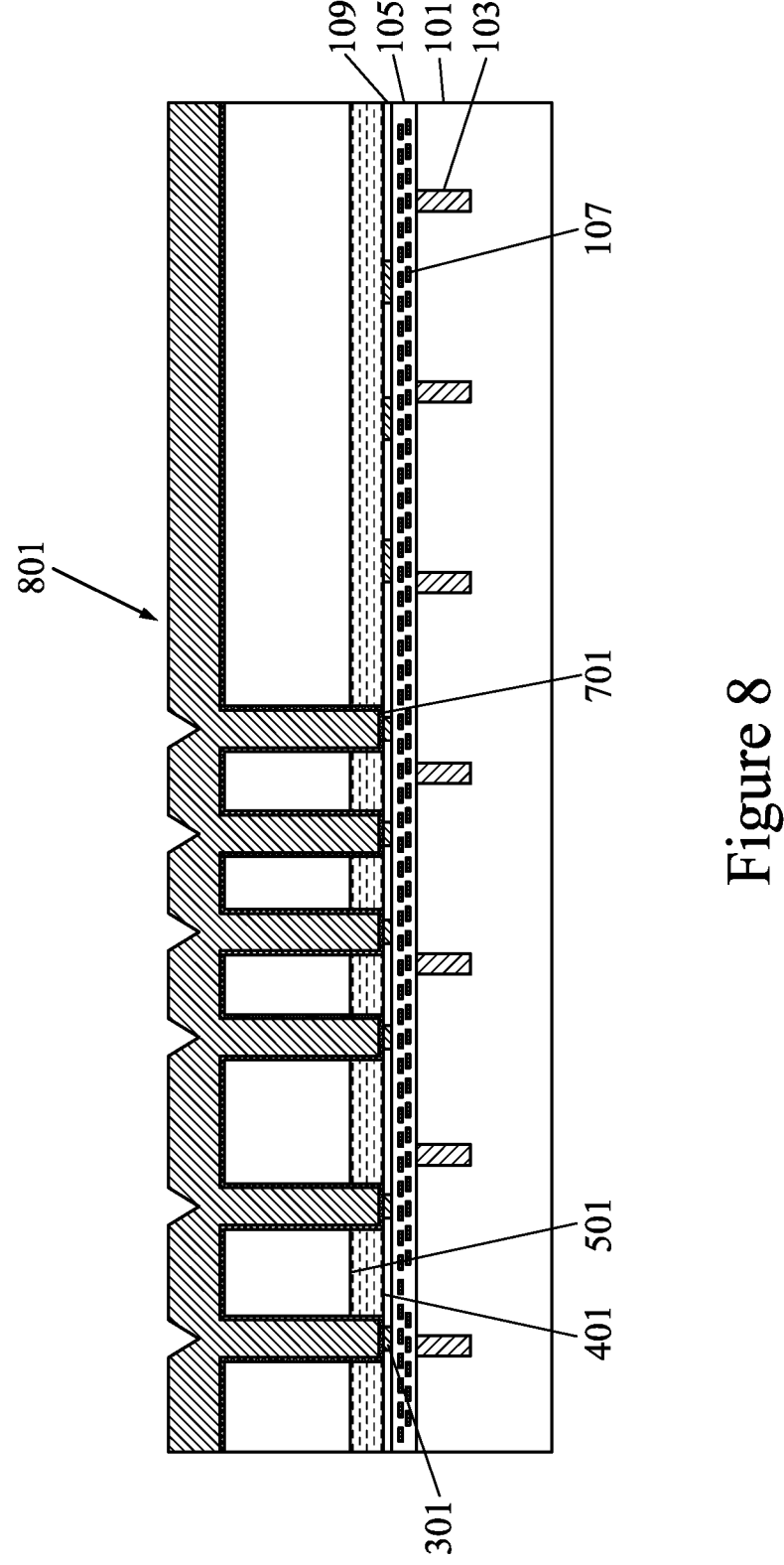
FIG. 8 illustrates the cross-sectional view of a conductive material over the seed layer, in accordance with some embodiments.

In FIG. 8, a conductive material 801 is formed in the openings 601 and over the topmost surface of the photoresist layer 501 on the seed layer 701. In some embodiments, the conductive material 801 is deposited to fill and/or overfill the openings 601. In some embodiments the conductive material 801 comprises one or more conductive materials, such as copper, tungsten, other conductive metals, or the like. The conductive material 801 may be formed by elec-troplating, electroless plating, or the like. In some embodi-ments, an electroplating process is used wherein the seed layer 701 is submerged or immersed in an electroplating solution. The seed layer 701 is electrically connected to the negative side of an external DC power supply such that the seed layer 701 functions as a cathode in the electroplating process. A solid conductive anode, such as a copper anode, is also immersed in the electroplating solution and is attached to the positive side of the external DC power supply. Atoms from the anode are dissolved into the elec-troplating solution, from which the cathode (e.g., the seed layer 701) acquires the atoms, thereby plating exposed conductive areas of the seed layer 701.

Figure 9:
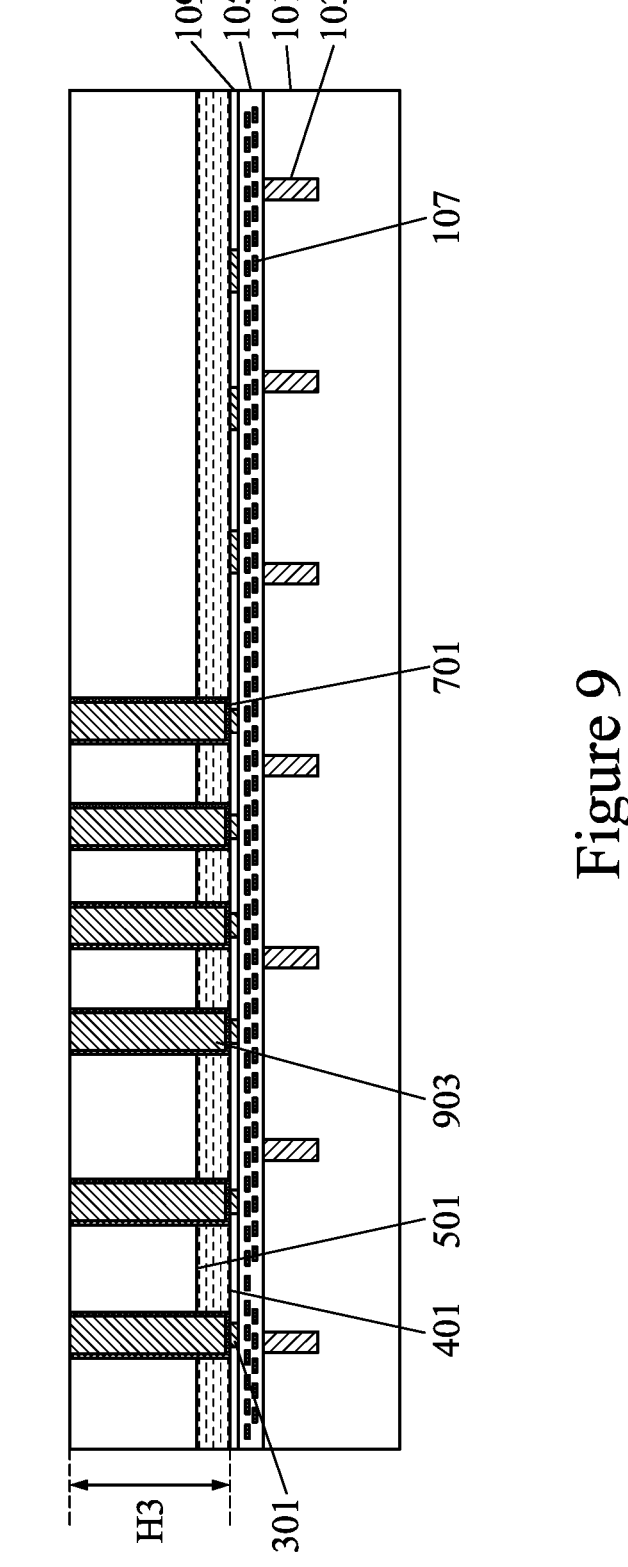
FIG. 9 illustrates the cross-sectional view of the conductive material planarized with the photoresist, in accordance with some embodiments.

In FIG. 9, the conductive material 801 is planarized with an upper surface of the photoresist layer 501. In some embodiments, a planarization process 901 is used to planar-ize the photoresist layer 501 and the conductive material 801 in order to form the conductive pillars 903. In some embodi-ments, the conductive pillars 903 comprise a core formed of the conductive material 801 and sidewalls formed of the seed layer 701, the conductive pillars 903 being in direct physical contact with the first subset of the first conductive connectors 301. The planarization process 901 removes the overfill of the conductive material 801 above the openings 601. In some embodiments, the planarization process removes the overfill of the conductive material 801 above the openings 601 as well as a portion of the topmost surface of the photoresist layer 501 and a portion of the conductive material 801 in the openings 601. In accordance with some embodiments the planarization process 901 may be performed such that the conductive pillars 903 are formed to a height H3, such as in the range of 2 μm to 7 μm. In some embodiments, the planarization process may be a process such as a chemical mechanical polishing process, a grinding process, one or more etch back processes, combinations of these, or the like. However, any suitable planarization process may be utilized.

Figure 10:
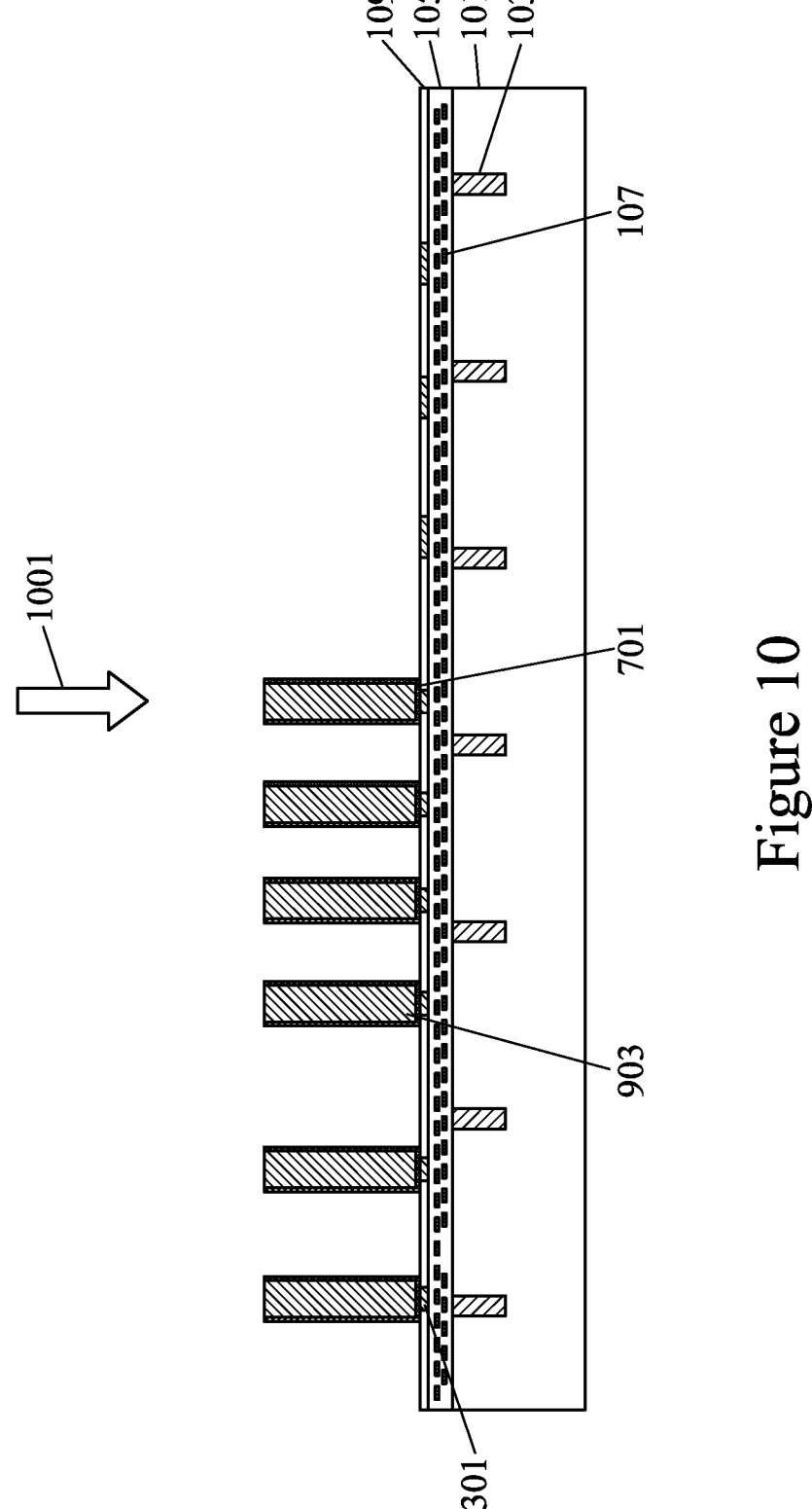
FIG. 10 illustrates the cross-sectional view of a removal of the passivation layer and the photoresist, in accordance with some embodiments.

In FIG. 10, the photoresist layer 501 and the passivation layer 401 are removed exposing the topmost surface of the first dielectric layer 109 and sidewalls of the conductive pillars 903. In accordance with some embodiments, a removal process 1001 comprises a first removal process (not separately illustrated) to remove the photoresist layer 501 and a second removal process (not separately illustrated) to remove the passivation layer 401.

In some embodiments in which the photoresist layer 501 comprises the single layer of photosensitive material, the first removal process includes an ashing or wet process. In an embodiment in which a wet process is utilized, a solvent such as a mixture of 70% propylene glycol monomethylether and 30% propylene glycol monomethylether acetate (in combination known as OK73) may be used. However, any appropriate solvent or etchant may be utilized in the wet process. For example, the photoresist layer 501 may be removed utilizing etchants such as $C_xF_y$, $O_2$, $H_2O$, and $N_2$. Further, the first removal process may be any appropriate processing step, such as an ashing process or the like.

In other embodiments in which the photoresist layer 501 comprises the tri-layer photoresist and the first removal process includes one or more removal processes sufficient to remove each of the individual layers. For example, top photosensitive layer may be removed using an ashing or wet process (as described above), the first intermediate mask layer may be removed using a wet or dry process, and the bottom anti-reflective coating may be removed using a suitable etching process. Any suitable removal processes may be utilized, and all such processes are fully intended to be included within the scope of the embodiments.

In some embodiments, the second removal process is any suitable process that removes the material of the passivation layer 401. In some embodiments the second removal process may include a dry removal or a wet removal, although any suitable process may be used. Additionally, once the passivation layer 401 has been removed, a subsequent cleaning process may be used in order to prepare for further processing. In some embodiments, the passivation layer cleaning process leaves the first dielectric layer 109 unactivated.

Following the removal process 1001 and formation of the conductive pillars 903, benefits are achieved in that a first bonding location type is provided for by the conductive pillars 903 and a second bonding location type is provided for by a second subset of the first conductive connectors 301. The second subset of the first conductive connectors 301 corresponding to the first conductive connectors 301 in which the conductive pillars 903 were not formed over and subsequently the second subset of the first conductive connectors 301 being exposed by the removal process 1001. The first bonding location type being suitable for various bonding methods (e.g. under-bump metallization bonding) and the second bonding location type being suitable for various bonding methods (e.g. hybrid bonding).

Figure 11:
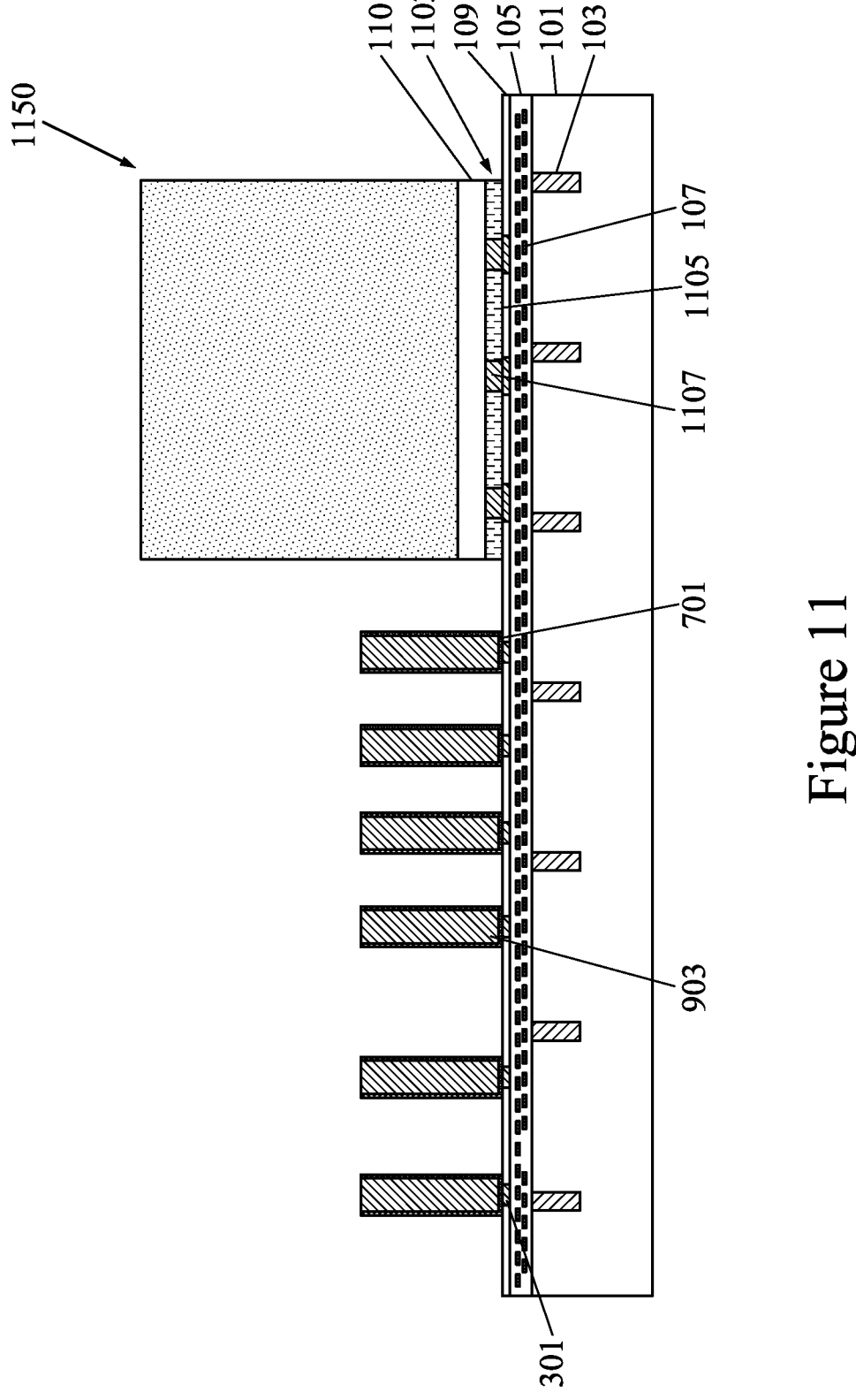
FIG. 11 illustrates the cross-sectional view of a semiconductor package component of a first type over the patterned dielectric layer, in accordance with some embodiments.

In FIG. 11, a first semiconductor device 1150 is attached to the topmost surface of the first dielectric layer 109. In some embodiments, the first semiconductor device 1150 is a Chip on Wafer (CoW) package component, and may be, for example, a System on Chip (SoC) die or a System on Integrated Chip (SoIC) die. However, any suitable functionality and any suitable device may be utilized.

In some embodiments the first semiconductor device 1150 may include one or more integrated circuit dies attached to an interposer 1101. The integrated circuit dies may be attached to the interposer 1101, which interconnects the integrated circuit dies. The interposer 1101 may further comprise a bonding layer 1103 and the bonding layer 1103 may comprise a second dielectric layer 1105 and second conductive connectors 1107. In some embodiments, the second conductive connectors 1107 may comprise a metal, like copper, titanium, tungsten, aluminum, or the like. In some embodiments, the second dielectric layer 1105 may comprise oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used for the second dielectric layer 1105, such as a polymer such as polybenzoxazole (PBO), polyimide, a benzocyclobutene (BCB) based polymer, or the like.

In other embodiments, the first semiconductor device 1150 is a singular semiconductor die and the interposer 1101 is not utilized. In this embodiment the first semiconductor device 1150 comprises a semiconductor material region, a metallization structure interconnecting active devices formed using the semiconductor material region, and a bonding layer comprising a dielectric material (e.g. the dielectric material discussed with respect to the second dielectric layer 1105) and a conductive metal (e.g. the metal discussed with respect to the second conductive connectors 1107). Any suitable devices may be utilized.

In an embodiment the first semiconductor device 1150 may be placed over the substrate 101 on the topmost surface of the first dielectric layer 109 such that a first subset of the first conductive connectors 301 in the first dielectric layer 109 are aligned with and in direct physical contact with the second conductive connectors 1107 in the second dielectric layer 1105. In some embodiments, aligning the second subset of the first conductive connectors 301 with the second conductive connectors 1107 may be done using a pick and place process, however, any suitable process may be utilized.

In some embodiments, once the first semiconductor device 1150 has been placed directly on the top most surface of the first dielectric layer 109 a hybrid bonding process is performed to bond the first semiconductor device 1150 to the substrate 101. In some embodiments, the hybrid bonding process forms a hybrid bond between the bonding layer 1103 of the first semiconductor device 1150 and a portion of the first dielectric layer 109 comprising the second subset of the first conductive connectors 301 without activating the topmost surface of the first dielectric layer 109 prior to placing the first semiconductor device 1150 onto the topmost surface of the first dielectric layer 109.

In some embodiments, once the bonding layer 1103 comes in physical contact with the portion of the first dielectric layer 109 comprising the second subset of the first conductive connectors 301 the hybrid bonding may be continued by subjecting the bonding layer 1103 and the portion of the first dielectric layer 109 comprising the first subset of the first conductive connectors 301 to a thermal treatment along with contact pressure. In some embodiments the first dielectric layer 109 and the second dielectric layer 1105 may be subjected to a pressure of about 200 kPa or less, and a temperature between about 200° C. and about 400° C. to strengthen the bond between the first dielectric layer 109 and the second dielectric layer 1105. The first conductive connectors 301 and the second conductive connectors 1107 may then be subjected to a temperature at or above the eutectic point for the materials of the first conductive connectors 301 and the second conductive connectors 1107, e.g., between about 150° C. and about 650° C., to fuse the first conductive connectors 301 to the second conductive connectors 1107. In this manner, fusion of the bonding layer 1103 of the first semiconductor device 1150 and the portion of the first dielectric layer 109 forms a hybrid bonded device comprising the resulting hybrid bond.

However, while specific processes have been described to initiate and strengthen the hybrid bonds between the first semiconductor device 1150 and the substrate 101, these descriptions are intended to be illustrative and are not intended to be limiting upon the embodiments. Rather, any suitable combination of baking, annealing, pressing, or other bonding processes or combination of processes may be utilized. All such processes are fully intended to be included within the scope of the embodiments. It should be appreciated that while hybrid bonding has been described as one method of bonding the first semiconductor device 1150 to the substrate 101, is only intended to be illustrative and is not intended to be limiting upon the embodiments. Rather, any suitable method of bonding, such as fusion bonding, copper-to-copper bonding, or the like, may also be utilized.

Figure 12:
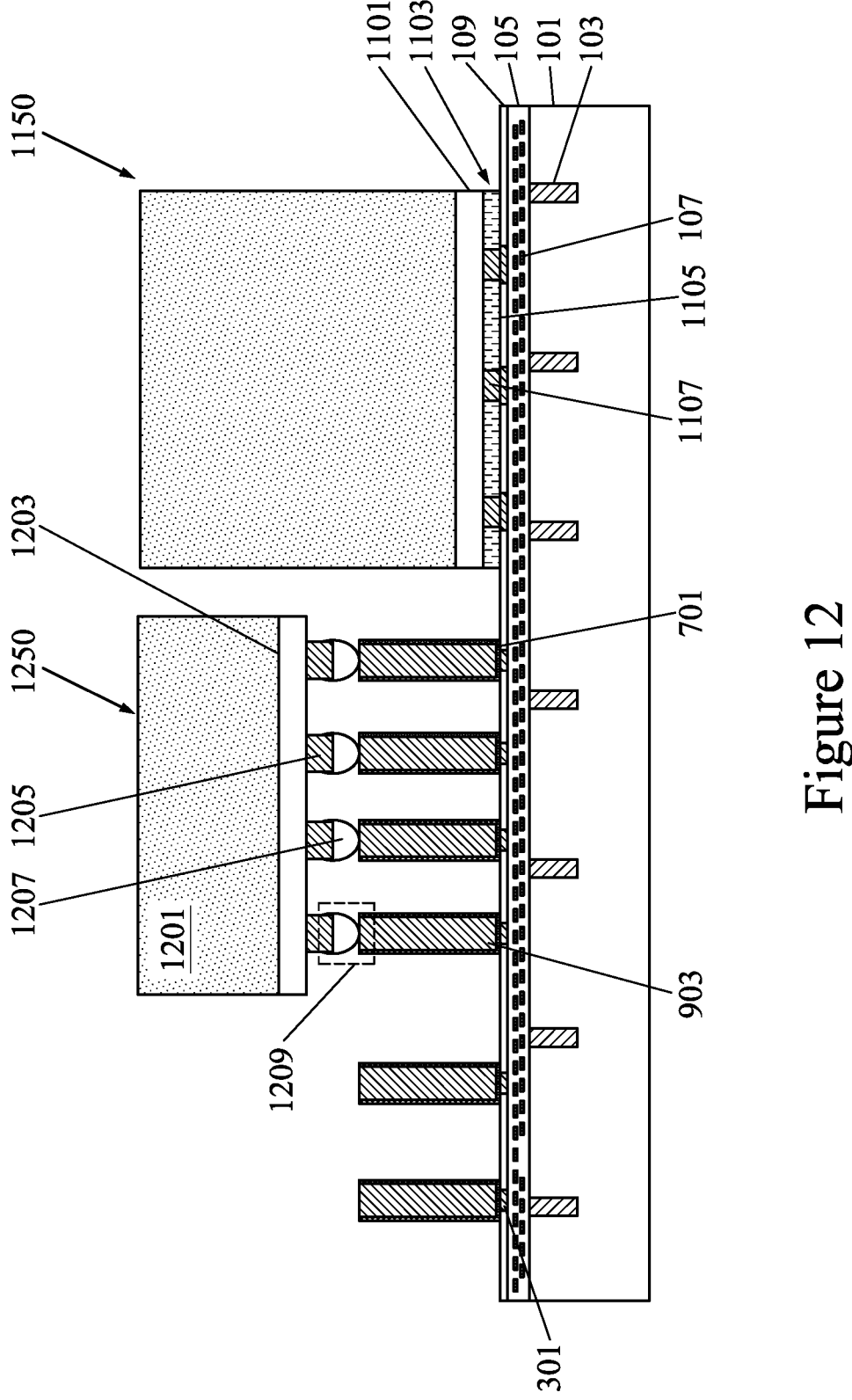
FIG. 12 illustrates the cross-sectional view of a semiconductor package component of a second type on a first set of conductive pillars, in accordance with some embodiments.

In FIG. 12, the second semiconductor device 1250 is attached to a first subset of the conductive pillars 903. In some embodiments, the second semiconductor device 1250 is a memory semiconductor package component that includes a memory die 1201 such as a DRAM die or a SRAM die, an interposer 1203 and first contact pads 1205. Third conductive connectors 1207 may be formed on the first contact pads 1205. In some embodiments, the third conductive connectors 1207 may include a conductive material such as solder, copper, aluminum, gold, nickel, silver, palladium, tin, the like, or a combination thereof. In some embodiments, the third conductive connectors 1207 are formed by initially forming a layer of solder through evaporation, electroplating, printing, solder transfer, ball placement, or the like. In some embodiments, an attachment of the second semiconductor device 1250 is performed by placing the second semiconductor device 1250 on the first subset of the conductive pillars 903 such that the third conductive connectors 1207 are in direct physical contact with the first subset of the conductive pillars 903. The third conductive connectors 1207 may be reflowed to form first under-bump metallization (UBM) joints 1209 between the first subset of the conductive pillars 903 and the second semiconductor device 1250.

Figure 13:
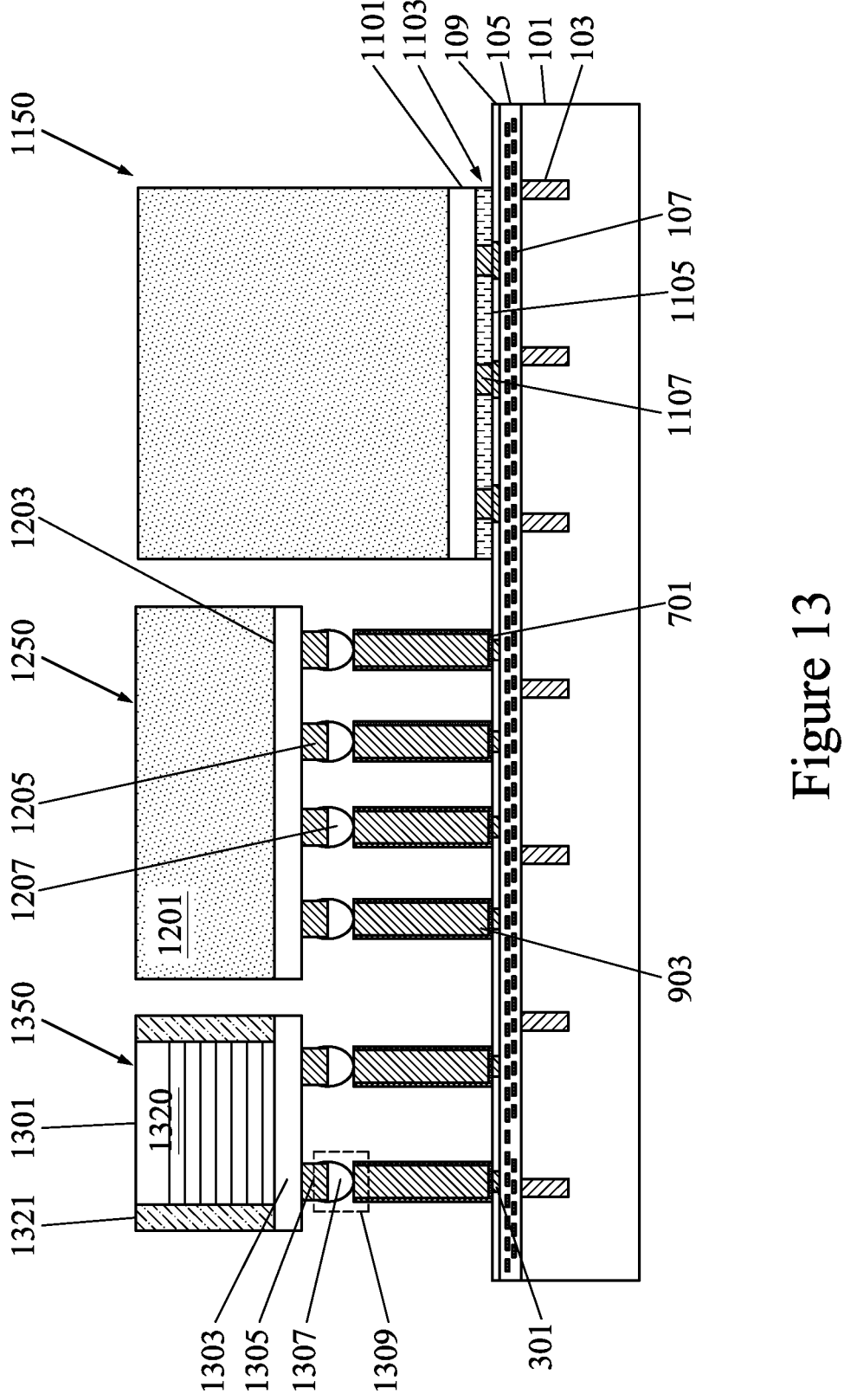
FIG. 13 illustrates the cross-sectional view of a semiconductor package component of a third type on a second set of conductive pillars, in accordance with some embodiments.

In FIG. 13, the third semiconductor device 1350 is attached to a second subset of the conductive pillars 903. In some embodiments, the third semiconductor device 1350 is a memory semiconductor package component, such as a high bandwidth memory (HBM) package that includes a semiconductor die stack 1320 comprising of memory dies 1301, an interposer 1303 and second contact pads 1305, wherein the semiconductor die stack 1320 is encapsulated in a molding compound 1321. Fourth conductive connectors 1307 may be formed on the second contact pads 1305. In some embodiments, the fourth conductive connectors 1307 may include a conductive material such as solder, copper, aluminum, gold, nickel, silver, palladium, tin, the like, or a combination thereof. In some embodiments, the fourth conductive connectors 1307 are formed by initially forming a layer of solder through evaporation, electroplating, printing, solder transfer, ball placement, or the like. In some embodiments, an attachment of the third semiconductor device 1350 is performed by placing the third semiconductor device 1350 on the second subset of the conductive pillars 903 such that the fourth conductive connectors 1307 are in direct physical contact with the second subset of the conductive pillars 903. The fourth conductive connectors 1307 may be reflowed to form second (UBM) joints 1309 between the second subset of the conductive pillars 903 and the third semiconductor device 1350.

Figure 14:
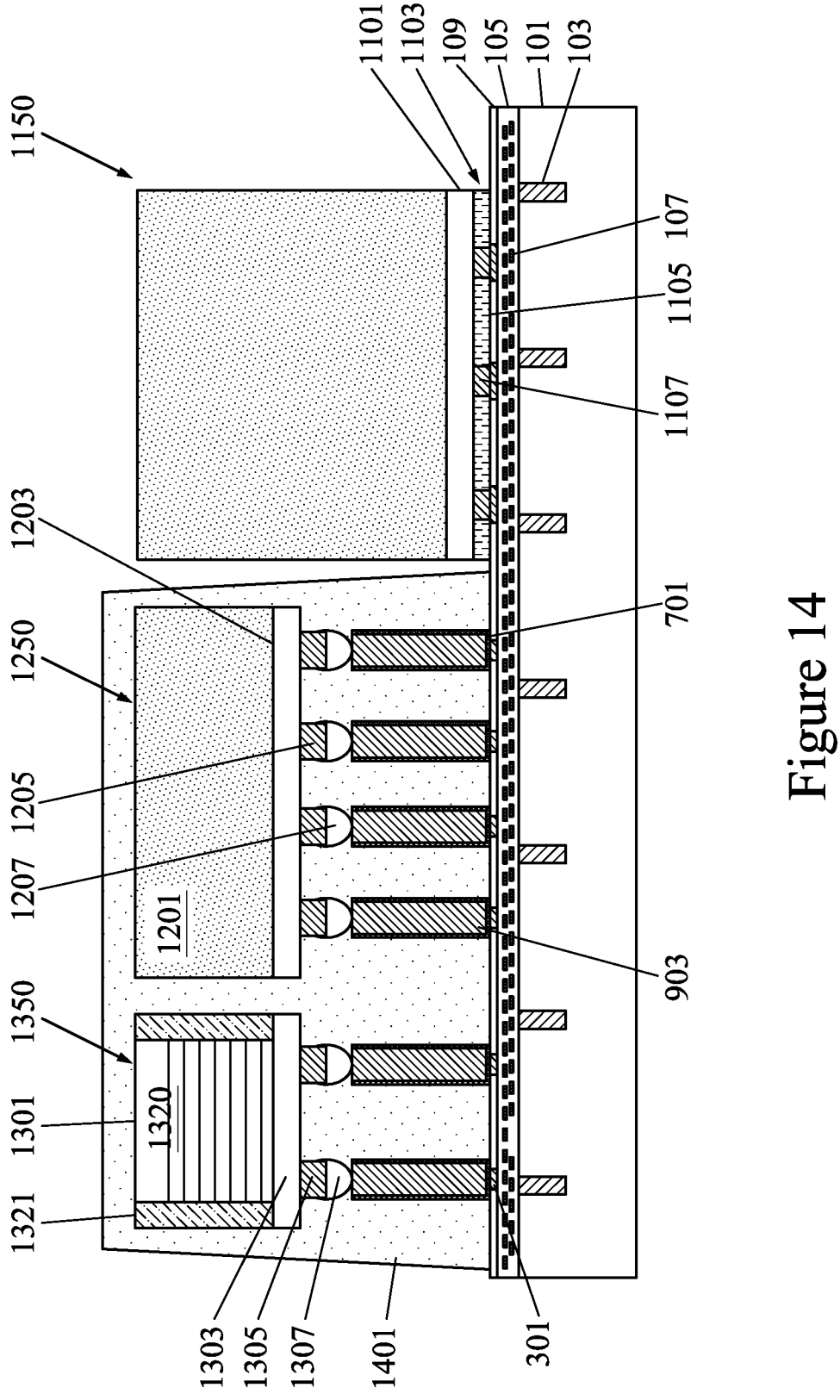
FIG. 14 illustrates the cross-sectional view of an underfill material over the semiconductor package component of the second type and the semiconductor package component of the third type, in accordance with some embodiments.

In FIG. 14, an underfill material 1401 is formed over the topmost surface of the first dielectric layer 109 and encompasses both the second semiconductor device 1250 and the third semiconductor device 1350. In some embodiments, the underfill material 1401 is a protective material used to cushion and support the conductive pillars 903, the first UBM joints 1209, the second UBM joints 1309, the first contact pads 1205, the second contact pads 1305, the second semiconductor device 1250, and the third semiconductor device 1350 from operational and environmental degradation, such as stresses caused by the generation of heat during operation. The underfill material 1401 may be placed using an injection process with capillary action or may be otherwise formed by any appropriate method. In some embodiments, the underfill material 1401 may comprise a liquid epoxy that is dispensed above the topmost surface of the first dielectric layer 109 to encompass the conductive pillars 903, the first UBM joints 1209, the second UBM joints 1309, the second semiconductor device 1250 and the third semiconductor device 1350. The underfill material 1401 may then be cured utilizing any suitable curing process.

Figure 15:
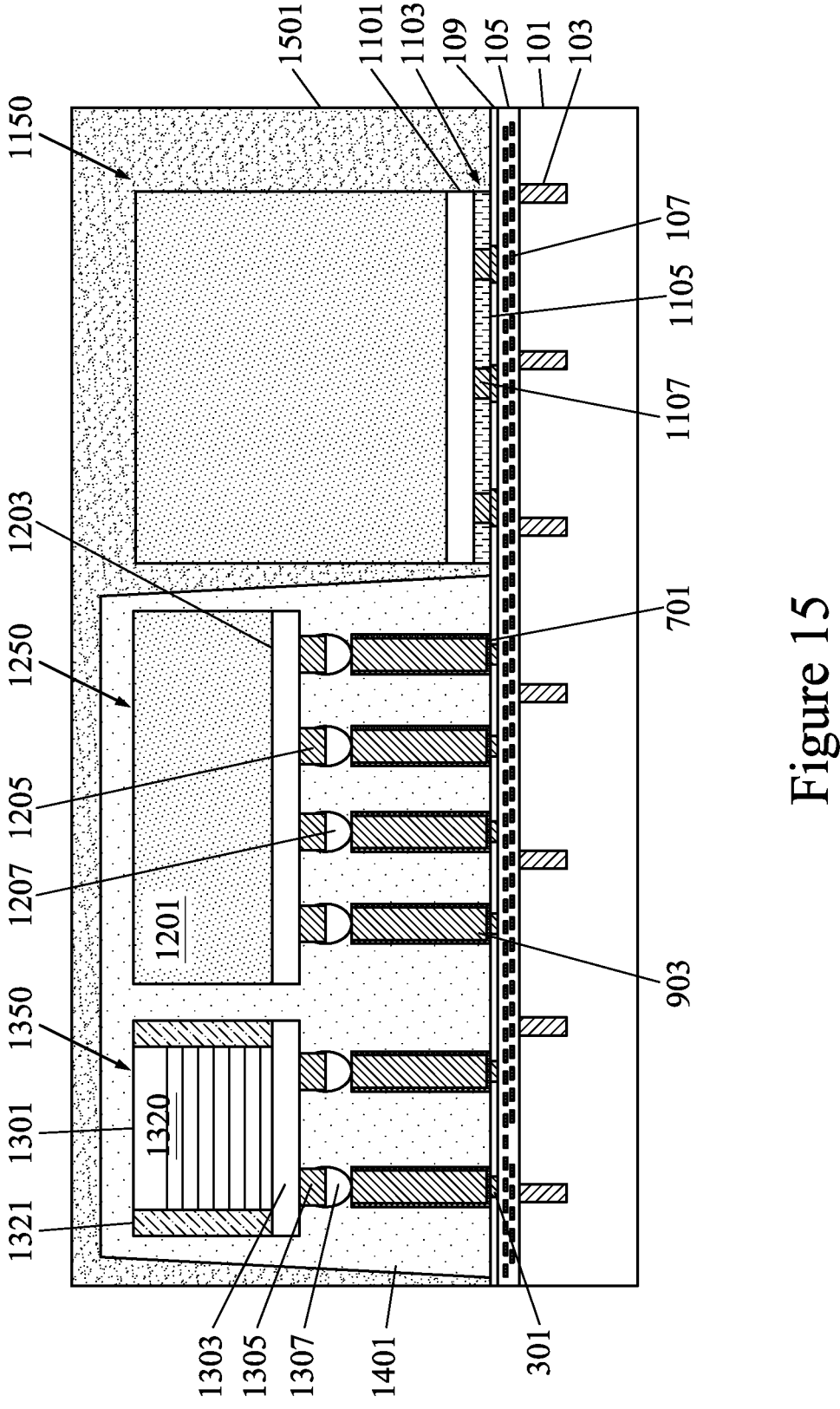
FIG. 15 illustrates the cross-sectional view of a molding compound over the semiconductor package component of the first type and the underfill material, in accordance with some embodiments.

In FIG. 15, an encapsulant 1501 is formed over the topmost surface of the first dielectric layer 109 and encompasses the first semiconductor device 1150 and the underfill material 1401 that encompasses the conductive pillars 903, the first UBM joints, the second UBM joints, the second semiconductor device 1250 and the third semiconductor device 1350. In some embodiments, the encapsulant 1501 may be a molding compound, epoxy, or the like. The encapsulant 1501 may be applied by compression molding, transfer molding, or the like. The encapsulant 1501 may be applied in liquid or semi-liquid form and cured to harden the encapsulant 1501.

Figure 16:
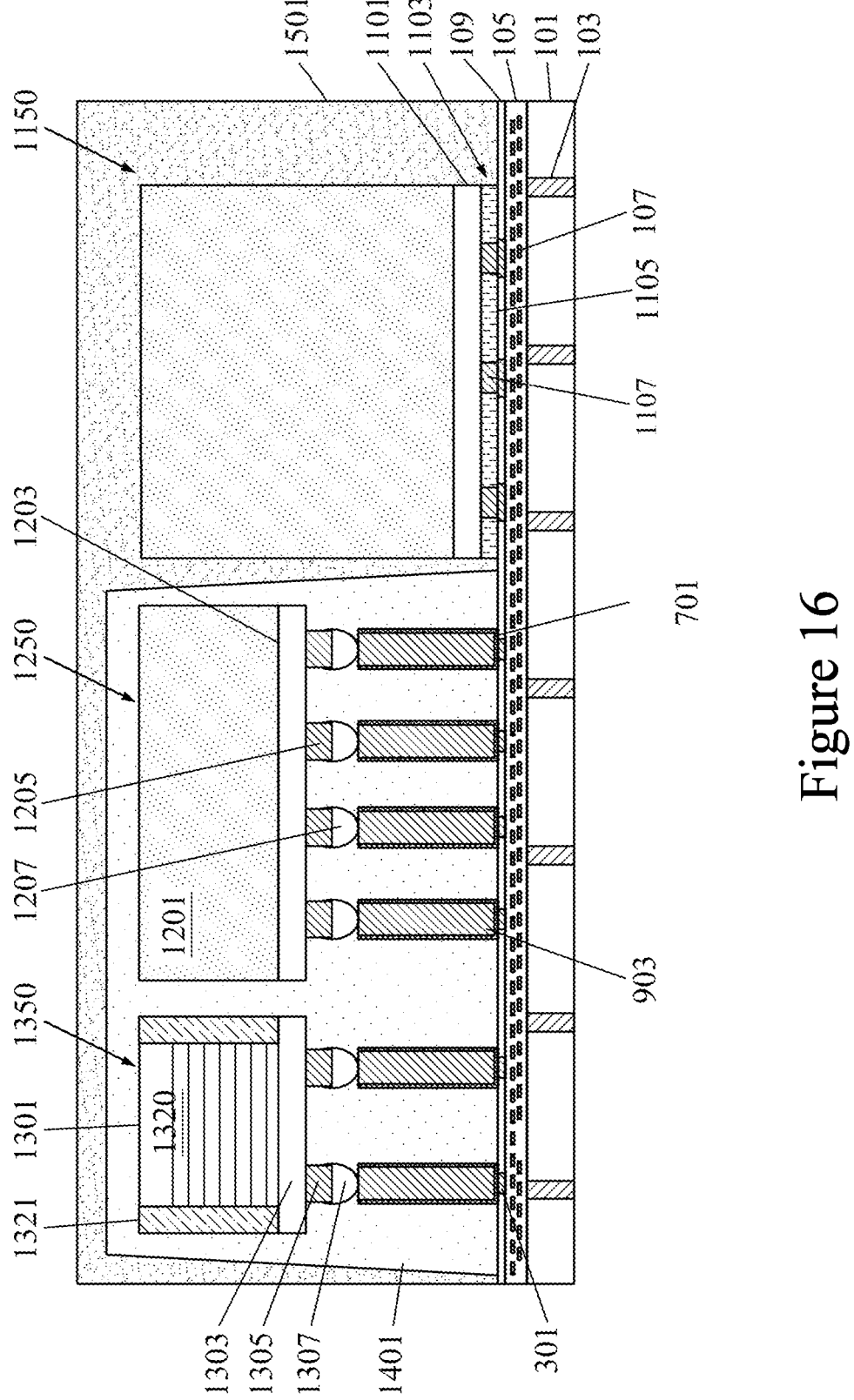
FIG. 16 illustrates the cross-sectional view of a planarization of the semiconductor substrate with through substrate vias, in accordance with some embodiments.

In FIG. 16, the substrate 101 is thinned to expose the through vias 103. Exposure of the through vias 103 may be accomplished by a thinning process, such as a grinding process, a chemical-mechanical polish (CMP), an etch-back, combinations thereof, or the like. In some embodiments (not separately illustrated), the thinning process for exposing the through vias 103 includes a CMP, and the through vias 103 protrude at a back-side of the package component substrate 101 as a result of dishing that occurs during the CMP. In such embodiments, an insulating layer (not separately illustrated) may optionally be formed on the back surface of the substrate 101, surrounding the protruding portions of the through vias 103. The insulating layer may be formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. After the substrate 101 is thinned, the exposed surfaces of the through vias 103 and the insulating layer (if present) or the substrate 101 are level with one another (i.e. planar), and are exposed at the back-side of the substrate 101.

Figure 17:
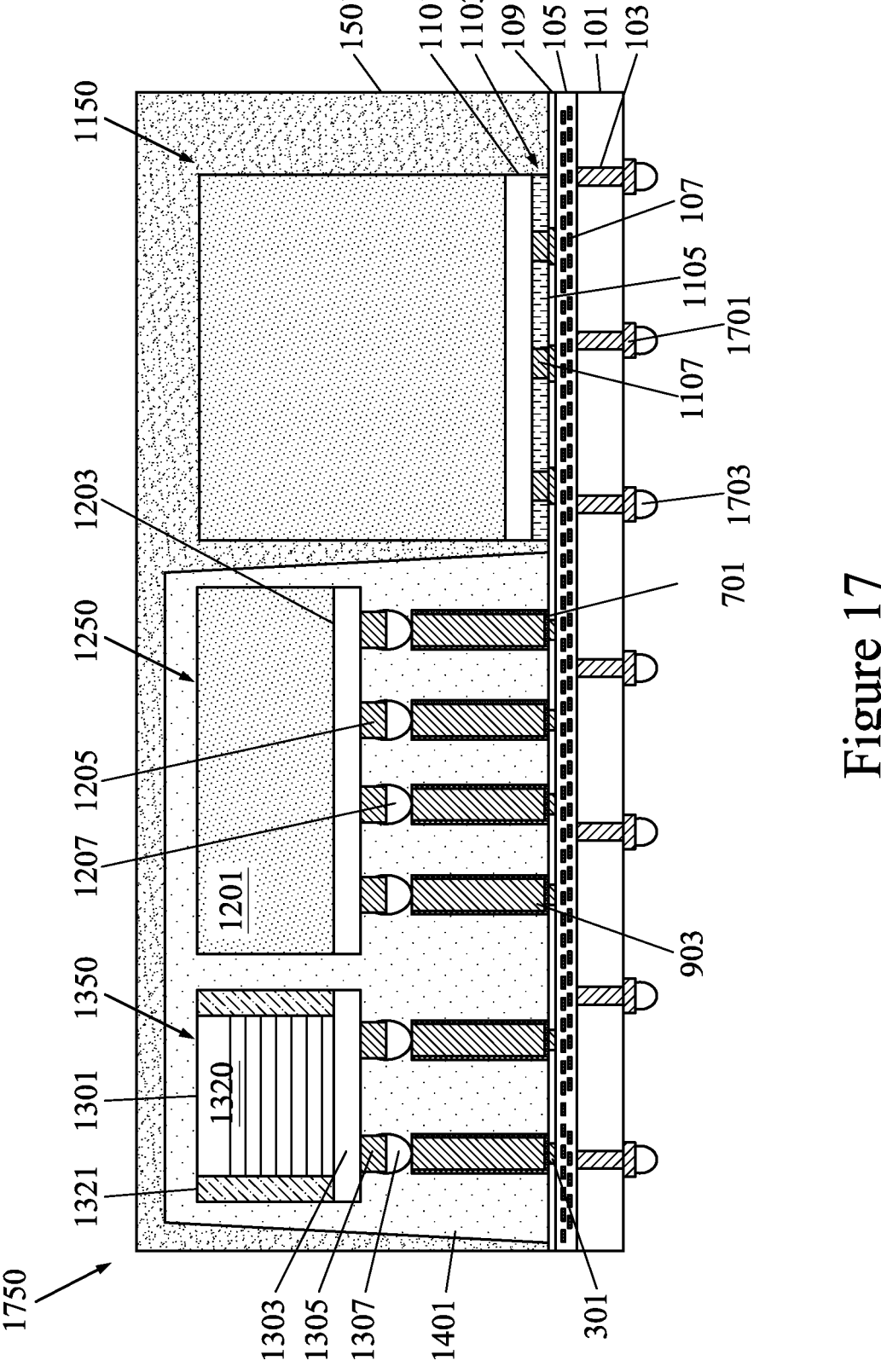
FIG. 17 illustrates the cross-sectional view of a conductive connector on a contact pad over the through substrate vias, in accordance with some embodiments.

In FIG. 17, UBMs 1701 are formed on the exposed surfaces of the through vias 103 and the substrate 101. As an example to form the UBMs 1701 in some embodiments, a seed layer (not separately illustrated) is formed over the exposed surfaces of the through vias 103 and the substrate 101. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 1701. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 1701.

Further, external connectors 1703 are formed on the UBMs 1701. The external connectors 1703 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The external connectors 1703 may include a conductive material such as solder, copper, aluminum, gold, nickel, silver, palladium, tin, the like, or a combination thereof. In some embodiments, the external connectors 1703 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the external connectors 1703 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Following the formation of the external connectors 1703 the resulting structure depicted in FIG. 17 is illustrative of the integrated circuit package 1750. The integrated circuit package 1750 is able to achieve benefits by utilizing multiple bonding methods to bond the various semiconductor devices to the substrate 101. For example, in some embodiments, the first semiconductor devices 1150 are attached to the substrate 101 through hybrid bonds and the second semiconductor devices 1250 and the third semiconductor devices 1350 are attached to the substrate by under-bump metallization joints (e.g. the first under-bump metallization joint 1209 and the second under-bump metallization joint 1309) formed between the conductive pillars 903 and the corresponding conductive connectors (i.e. the third conductive connectors 1207 and the fourth conductive connectors 1307). The utilization of multiple bonding methods to bond the various semiconductor devices (e.g. the first semiconductor devices 1150, the second semiconductor devices 1250, and the third semiconductor devices 1350) to the substrate 101 allows for cheaper and more flexible integration of a greater variety of semiconductor devices into the integrated circuit package 1750.

In FIGS. 18A-18D, various top-down views of the integrated circuit package 1750 are depicted in which the first semiconductor devices 1150, the second semiconductor devices 1250, and the third semiconductor devices 1350 are arranged in different orientations. The encapsulant 1501 directly over the first semiconductor devices 1150, the second semiconductor devices 1250, and the third semiconductor devices 1350 along with the underfill material 1401 directly over the second semiconductor devices 1250 and the third semiconductor devices 1350 are not shown as to more clearly illustrate the various orientations. Any specific number of the first semiconductor devices 1150, the second semiconductor devices 1250, and the third semiconductor devices 1350 depicted are merely illustrative and fewer or more semiconductor devices are intended to be included within the scope of this disclosure. Further, any combination of the embodiments with respect to orientation and number of semiconductor devices is also intended to be included within the scope of this disclosure.

Figures 18A, 18B, 18C, 18D:
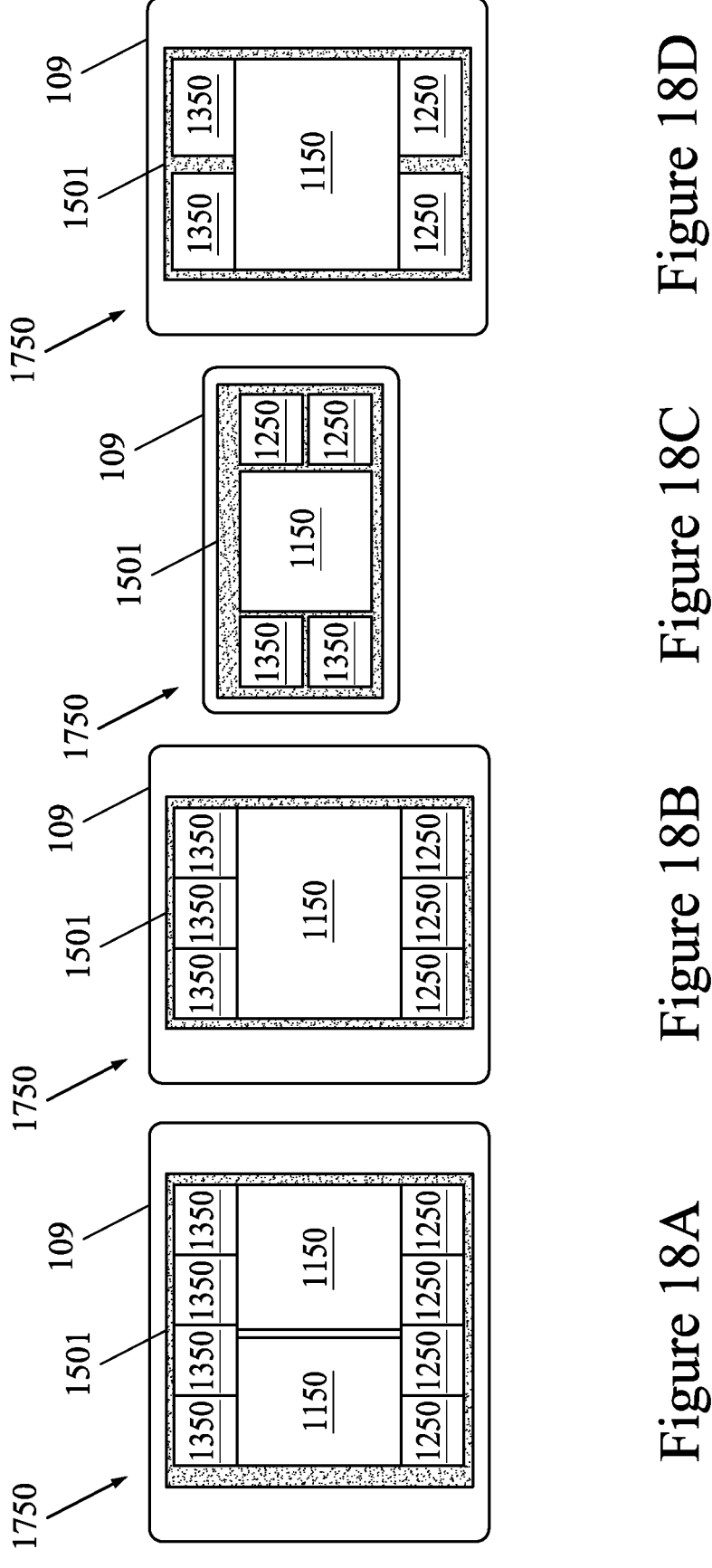
FIGS. 18A-18D illustrates several top down views of various representative orientations of semiconductor package components of the integrated circuit package over the semiconductor substrate, in accordance with some embodiments.

In FIG. 18A, in accordance with some embodiments, more than one of the first semiconductor devices 1150 are attached to the substrate 101 with more than one of the second semiconductor devices 1250 attached to the substrate 101 positioned above the first semiconductor devices 1150 (in the top-down view) and more than one of the third semiconductor devices 1350 positioned on an opposite side (i.e. below the first semiconductor devices 1150 in a top-down view) of the first semiconductor devices 1150 from the second semiconductor devices 1250. In some embodiments, a ratio of the second semiconductor devices 1250 to the first semiconductor devices 1150 is 2:1, a ratio of the third semiconductor devices 1350 to 1150 is 2:1, and a ratio of the second semiconductor devices 1250 to the third semiconductor devices 1350 is 1:1.

In FIG. 18B, in accordance with some embodiments, one first semiconductor device 1150 is attached to the substrate 101 with more than one of the second semiconductor devices 1250 attached to the substrate 101 positioned above the first semiconductor device 1150 (in the top-down view) and more than one of the third semiconductor devices 1350 positioned on an opposite side (i.e. below the first semiconductor device 1150 in a top-down view) of the first semiconductor device 1150 from the second semiconductor devices 1250. In some embodiments, a ratio of the second semiconductor devices 1250 to the first semiconductor device 1150 is 3:1, a ratio of the third semiconductor devices 1350 to 1150 is 3:1, and a ratio of the second semiconductor devices 1250 to the third semiconductor devices 1350 is 1:1.

In FIG. 18C, in accordance with some embodiments, one first semiconductor device 1150 is attached to the substrate 101 with more than one of the second semiconductor devices 1250 attached to the substrate 101 positioned on a left side of the first semiconductor device 1150 (in the top-down view) and more than one of the third semiconductor devices 1350 positioned on an opposite side (i.e. on a right side of the first semiconductor device 1150 in a top-down view) of the first semiconductor device 1150 from the second semiconductor devices 1250. In this embodiment, the integrated circuit package 1750 has a greater length (from a left side of the integrated circuit package 1750 to a right side of the integrated circuit package 1750 in the top-down view) than width (from a bottom side of the integrated circuit package 1750 to a top side of the integrated circuit package 1750 in the top-down view).

In FIG. 18D, in accordance with some embodiments, one first semiconductor device 1150 is attached to the substrate 101 with more than one of the second semiconductor devices 1250 attached to the substrate 101 positioned above the first semiconductor device 1150 (in the top-down view) and more than one of the third semiconductor devices 1350 positioned on an opposite side (i.e. below the first semiconductor device 1150 in the top-down view) of the first semiconductor device 1150 from the second semiconductor devices 1250. In this embodiment, the integrated circuit package 1750 has a lesser length (from a left side of the integrated circuit package 1750 to a right side of the integrated circuit package 1750 in the top-down view) than width (from a bottom side of the integrated circuit package 1750 to a top side of the integrated circuit package 1750 in the top-down view).

Figure 19A:
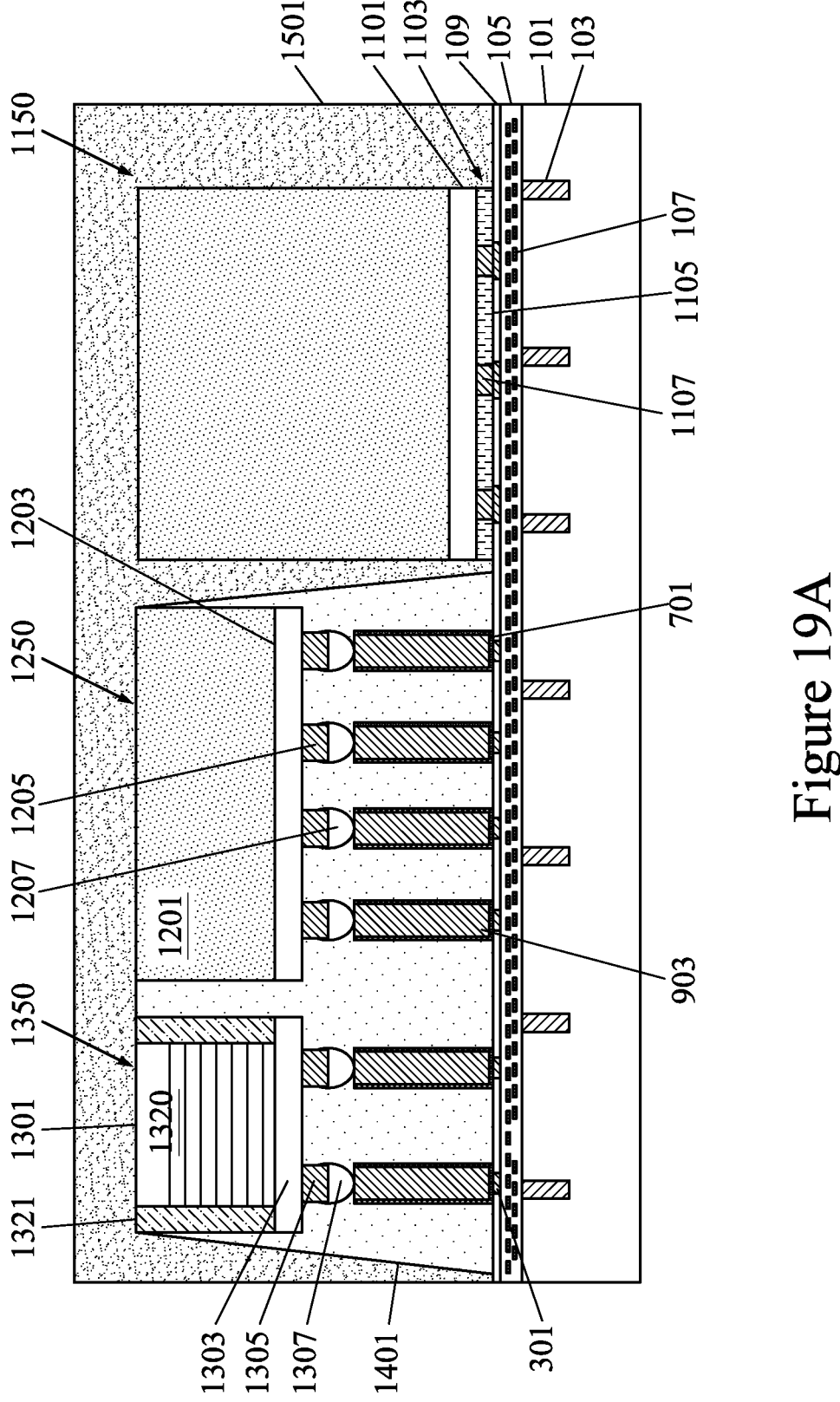
FIGS. 19A-19B illustrates the cross-sectional views of the underfill material partially encompassing the semiconductor package component of the second type and the semiconductor package component of the third type during an intermediate step and in the integrated circuit package, in accordance with some embodiments.

In FIG. 19A, an additional embodiment is depicted of an intermediate step of forming the integrated circuit package 1750 in which the underfill material 1401 is formed in a similar manner as discussed above with respect to FIG. 14, however in this embodiment the underfill material 1401 is formed over the topmost surface of the first dielectric layer 109 such that the underfill material 1401 partially encompasses both the second semiconductor device 1250 and the third semiconductor device 1350 as opposed to completely encompassing both the second semiconductor device 1250 and the third semiconductor device 1350. In this embodiment a topmost surface of the second semiconductor device 1250 and a topmost surface of the third semiconductor device 1350 are not covered by the underfill material 1401. The underfill material 1401 may have curved surfaces following the injection process.

Figure 19B:
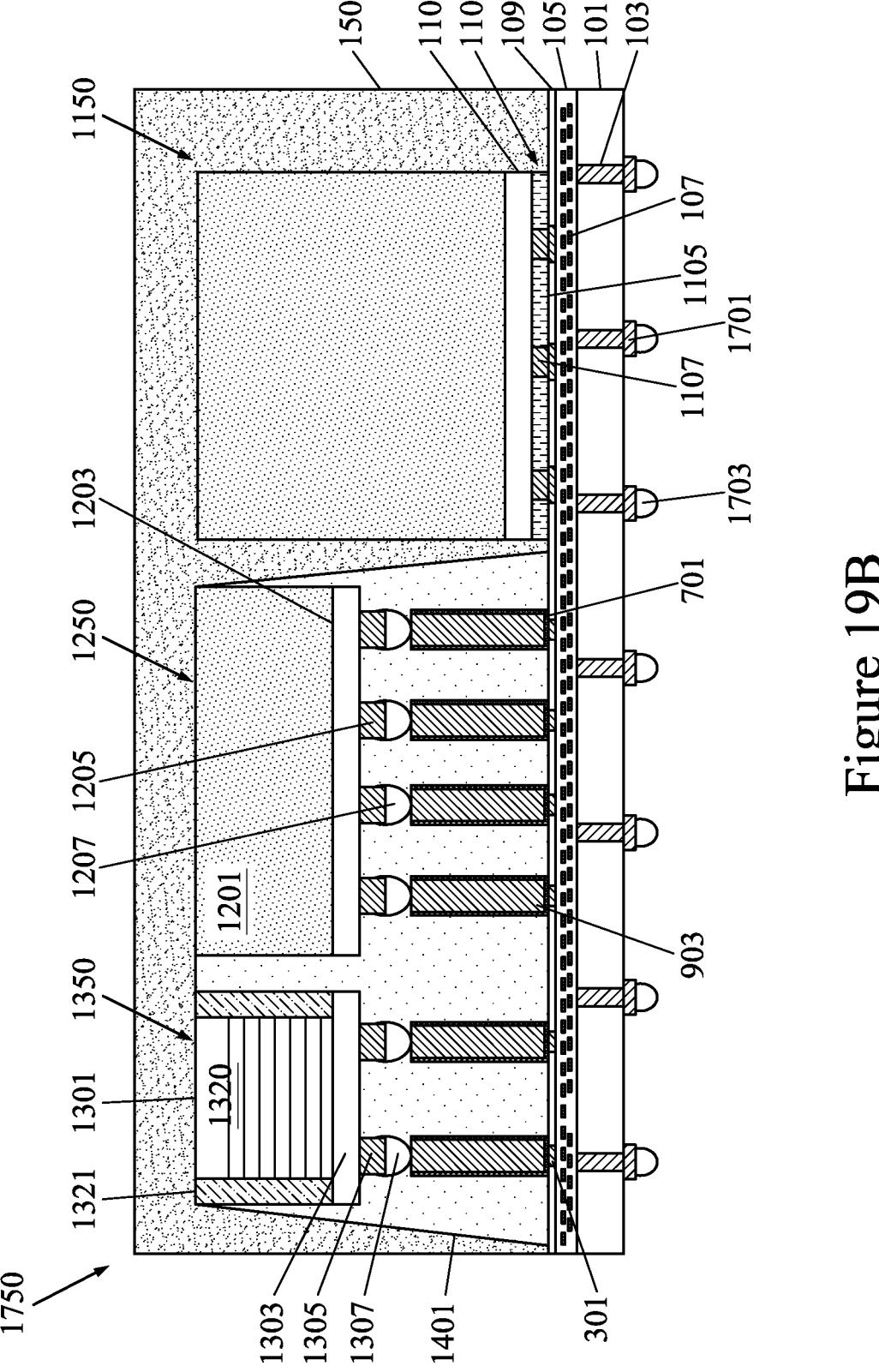

Looking next at FIG. 19B, FIG. 19B illustrates a continuation of the manufacturing process illustrated and described above with respect to FIGS. 16-17 from the structure illustrated in FIG. 19A. As illustrated, the substrate 101 is thinned, and the UBMs 1701 and external connectors 1703 are formed to provide backside connections. In this embodiment, however, the underfill material 1401 of the integrated circuit package 1750 remains such that the underfill material 1401 does not cover the topmost surface of the second semiconductor device 1250 and of the third semiconductor device 1350. However, any suitable manufacturing processes may be utilized to complete the structure.

By building up the photoresist layer 501 and the passivation layer 401 and patterning the photoresist layer 501 and passivation layer 401 to form the conductive pillars 903 above the first dielectric layer 109 with the first conductive connectors 301 benefits can be achieved by providing a method for which different types of semiconductor devices (e.g. the first semiconductor devices 1150 the second semiconductor devices 1250, and the third semiconductor devices 1350) may be attached to the substrate 101 by either forming an UBM joint with the conductive pillars 903 or by forming direct bonds to the first dielectric layer 109 and/or the first conductive connectors 301. This heterogeneous integration scheme enables the attachment of various semiconductor package components with greater flexibility.

In accordance with some embodiments of the present disclosure a method includes: depositing a photoresist layer over a dielectric layer with conductive connectors; forming conductive pillars extending through the photoresist layer, the conductive pillars making physical contact with a first subset of the conductive connectors; after forming the conductive pillars removing the photoresist layer; attaching a first semiconductor component directly to the dielectric layer; and attaching a second semiconductor component to the conductive pillars. In an embodiment the first semiconductor component includes a system on integrated chip. In an embodiment the attaching the first semiconductor component directly to the dielectric layer further includes forming a hybrid bond between the first semiconductor component and an interposer, wherein the interposer includes the dielectric layer with the conductive connectors. In an embodiment further including forming through vias embedded in the interposer, wherein the through vias are electrically coupled to both the first semiconductor component and the second semiconductor component. In an embodiment the second semiconductor component includes a dynamic random-access memory die. In an embodiment further including attaching a third semiconductor component to the conductive pillars. In an embodiment the third semiconductor component includes a high bandwidth memory die.

In accordance with some embodiments of the present disclosure a method includes: forming conductive pillars on a first subset of conductive connectors, the conductive connectors being embedded in a dielectric layer; adhering by a hybrid bond a first semiconductor device to a second subset of the conductive connectors; and utilizing a first under-bump metallization joint to adhere a second semiconductor device to the conductive pillars. In an embodiment further including depositing an underfill material, wherein the underfill material encompasses the second semiconductor device. In an embodiment further including depositing an encapsulant, wherein the encapsulant encompasses the first semiconductor device and the underfill material. In an embodiment further including utilizing a second under-bump metallization joint to adhere a third semiconductor device to the conductive pillars. In an embodiment further including: an interposer on an opposite side of the dielectric layer from the conductive pillars; and through vias extending through the interposer to an opposite side of the interposer from the conductive pillars. In an embodiment the interposer is an active die.

In accordance with some embodiments of the present disclosure a semiconductor device includes: conductive connectors embedded in a dielectric layer over an interposer; conductive pillars in direct physical contact with a first subset of the conductive connectors; a first semiconductor device in direct physical contact with a second subset of the conductive connectors; a second semiconductor device in direct physical contact with the conductive pillars; and a third semiconductor device in direct physical contact with the conductive pillars. In an embodiment from a top-down view the second semiconductor device is attached to the conductive pillars positioned above the first semiconductor device and the third semiconductor device is attached to the conductive pillars positioned below the first semiconductor device. In an embodiment further including: an underfill covering the second semiconductor device and the third semiconductor device; and a molding compound encapsulating the underfill and the first semiconductor device. In an embodiment the second semiconductor device includes a static random access memory die. In an embodiment further including first under-bump metallization joints between the conductive pillars and the second semiconductor device. In an embodiment further including second under-bump metallization joints between the conductive pillars and the third semiconductor device. In an embodiment the conductive pillars have a height above the dielectric layer, the height ranging from 2 μm to 7 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a photoresist layer over a dielectric layer and over a set of conductive connectors, the set of conductive connectors including a first subset of conductive connectors and a second subset of conductive connectors different from the first subset;
patterning the photoresist layer to expose the first subset of conductive connectors, while leaving the second subset of conductive connectors unexposed;
forming a metal seed layer on the photoresist layer and on the exposed first subset of conductive connectors;
depositing a metal layer on the metal seed layer;
planarizing the metal layer to be coplanar with the photoresist layer;
removing the photoresist layer and portions of the metal layer overlying the photoresist layer to form conductive pillars on the first subset of conductive connectors, the conductive pillars making physical contact with a first subset of the conductive connectors;
attaching a first semiconductor component directly to the dielectric layer; and
attaching a second semiconductor component to the conductive pillars.

2. The method of claim 1, wherein the first semiconductor component comprises a system on integrated chip.

3. The method of claim 1, wherein the attaching the first semiconductor component directly to the dielectric layer further comprises forming a hybrid bond between the first semiconductor component and an interposer, wherein the interposer comprises the dielectric layer with the conductive connectors.

4. The method of claim 3, further comprising forming through vias embedded in the interposer, wherein the through vias are electrically coupled to both the first semiconductor component and the second semiconductor component.

5. The method of claim 1, wherein the second semiconductor component comprises a dynamic random-access memory die.

6. The method of claim 1, further comprising attaching a third semiconductor component to the conductive pillars.

7. The method of claim 6, wherein the third semiconductor component comprises a high bandwidth memory die.

8. A method comprising:
forming conductive pillars on a first subset of conductive connectors, the conductive connectors being embedded in a dielectric layer;
adhering by a hybrid bond a first semiconductor device to a second subset of the conductive connectors; and
utilizing a first under-bump metallization joint to adhere a second semiconductor device to the conductive pillars; and
depositing an underfill material, wherein the underfill material encompasses the second semiconductor device.

9. The method of claim 8, further comprising depositing the underfill material using an injection process.

10. The method of claim 9, further comprising depositing an encapsulant, wherein the encapsulant encompasses the first semiconductor device and the underfill material.

11. The method of claim 8, further comprising utilizing a second under-bump metallization joint to adhere a third semiconductor device to the conductive pillars.

12. The method of claim 8, further comprising:
an interposer on an opposite side of the dielectric layer from the conductive pillars; and
through vias extending through the interposer to an opposite side of the interposer from the conductive pillars.

13. The method of claim 12, wherein the interposer is an active die.

14. A method comprising:
embedding conductive connectors in a dielectric layer, the dielectric layer being formed over an interposer;
forming conductive pillars in direct physical contact with a first subset of the conductive connectors;
provisioning a first semiconductor device in direct physical contact with a second subset of the conductive connectors;
provisioning a second semiconductor device in direct physical contact with the conductive pillars; and
provisioning a third semiconductor device in direct physical contact with the conductive pillars.

15. The method of claim 14, attaching the second semiconductor device to the conductive pillars positioned above the first semiconductor device, in a top-down view, and attaching the third semiconductor device to the conductive pillars positioned below the first semiconductor device in the top-down view.

16. The method of claim 14, further comprising:
depositing an underfill covering the second semiconductor device and the third semiconductor device; and
encapsulating the underfill and the first semiconductor device with a molding compound.

17. The method of claim 14, wherein the step of provisioning the second semiconductor device includes providing a random access memory die in direct physical contact with the conductive pillars.

18. The method of claim 14, further comprising forming first under-bump metallization joints between the conductive pillars and the second semiconductor device.

19. The method of claim 18, further comprising forming second under-bump metallization joints between the conductive pillars and the third semiconductor device.

20. The method of claim 14, wherein the conductive pillars have a height above the dielectric layer, the height ranging from 2 μm to 7 μm.

* * * * *